(12) United States Patent
Wang et al.

(10) Patent No.: US 12,368,956 B2
(45) Date of Patent: Jul. 22, 2025

(54) OPTICAL SYSTEM

(71) Applicant: TDK TAIWAN CORP., Taoyuan (TW)

(72) Inventors: Chao-Hsi Wang, Taoyuan (TW); Chao-Chang Hu, Taoyuan (TW); Kuen-Wang Tsai, Taoyuan (TW); Chih-Wei Weng, Taoyuan (TW)

(73) Assignee: TDK TAIWAN CORP., Taoyuan (TW)

( * ) Notice: Subject to any disclaimer, the term of this patent is extended or adjusted under 35 U.S.C. 154(b) by 738 days.

(21) Appl. No.: 17/554,290

(22) Filed: Dec. 17, 2021

(65) Prior Publication Data

US 2022/0196966 A1 Jun. 23, 2022

Related U.S. Application Data

(60) Provisional application No. 63/127,746, filed on Dec. 18, 2020.

(51) Int. Cl.

| G02B 7/09 | (2021.01) |
| G02B 7/04 | (2021.01) |
| G02B 13/00 | (2006.01) |
| G02B 26/00 | (2006.01) |
| G02B 26/08 | (2006.01) |
| G02B 27/64 | (2006.01) |
| G03B 5/00 | (2021.01) |
| G03B 13/36 | (2021.01) |
| G06F 3/01 | (2006.01) |
| H04N 23/54 | (2023.01) |
| H04N 23/57 | (2023.01) |
| H04N 23/68 | (2023.01) |
| H10N 30/00 | (2023.01) |
| H10N 30/80 | (2023.01) |

(52) U.S. Cl.
CPC ............ *H04N 23/687* (2023.01); *G02B 7/04* (2013.01); *G02B 7/09* (2013.01); *G02B 13/0015* (2013.01); *G02B 26/00* (2013.01); *G02B 26/0875* (2013.01); *G02B 27/64* (2013.01); *G02B 27/646* (2013.01); *G06F 3/016* (2013.01); *H04N 23/54* (2023.01); *H04N 23/57* (2023.01); *H10N 30/101* (2024.05); *H10N 30/802* (2023.02)

(58) Field of Classification Search
CPC .... G02B 7/09; G02B 27/646; G02B 13/0015; G02B 26/00; G02B 7/04; H04N 23/54; H04N 23/57; H10N 30/101; H10N 30/802
USPC .................................................. 359/822, 824
See application file for complete search history.

(56) References Cited

U.S. PATENT DOCUMENTS

| 260,076 A | * | 6/1882 | Andrén | ................ G03B 17/045 |
| | | | | 396/150 |
| 2018/0356609 A1 | * | 12/2018 | Kim | ........................ G03B 13/34 |
| 2018/0356610 A1 | * | 12/2018 | Chen | ......................... G02B 7/09 |

(Continued)

*Primary Examiner* — Ricky L Mack
*Assistant Examiner* — Elizabeth M Hall
(74) *Attorney, Agent, or Firm* — MUNCY, GEISSLER, OLDS & LOWE, P.C.

(57) ABSTRACT

An optical system is provided. The optical system includes a first optical module, a fixed portion, and a driving module. The first optical module is used for connecting to a first optical element. The first optical module is movable relative to the fixed portion. The driving module is used for driving the first optical module to move relative to the fixed portion. The fixed portion includes an opening corresponding to the first optical module.

8 Claims, 19 Drawing Sheets

(56) References Cited

U.S. PATENT DOCUMENTS

| | | | |
|---|---|---|---|
| 2019/0294026 A1* | 9/2019 | Sugawara | G03B 3/10 |
| 2020/0225442 A1* | 7/2020 | Weng | G02B 27/646 |
| 2020/0363607 A1* | 11/2020 | Fan | H04N 23/55 |
| 2021/0149150 A1* | 5/2021 | Park | G02B 27/646 |

* cited by examiner

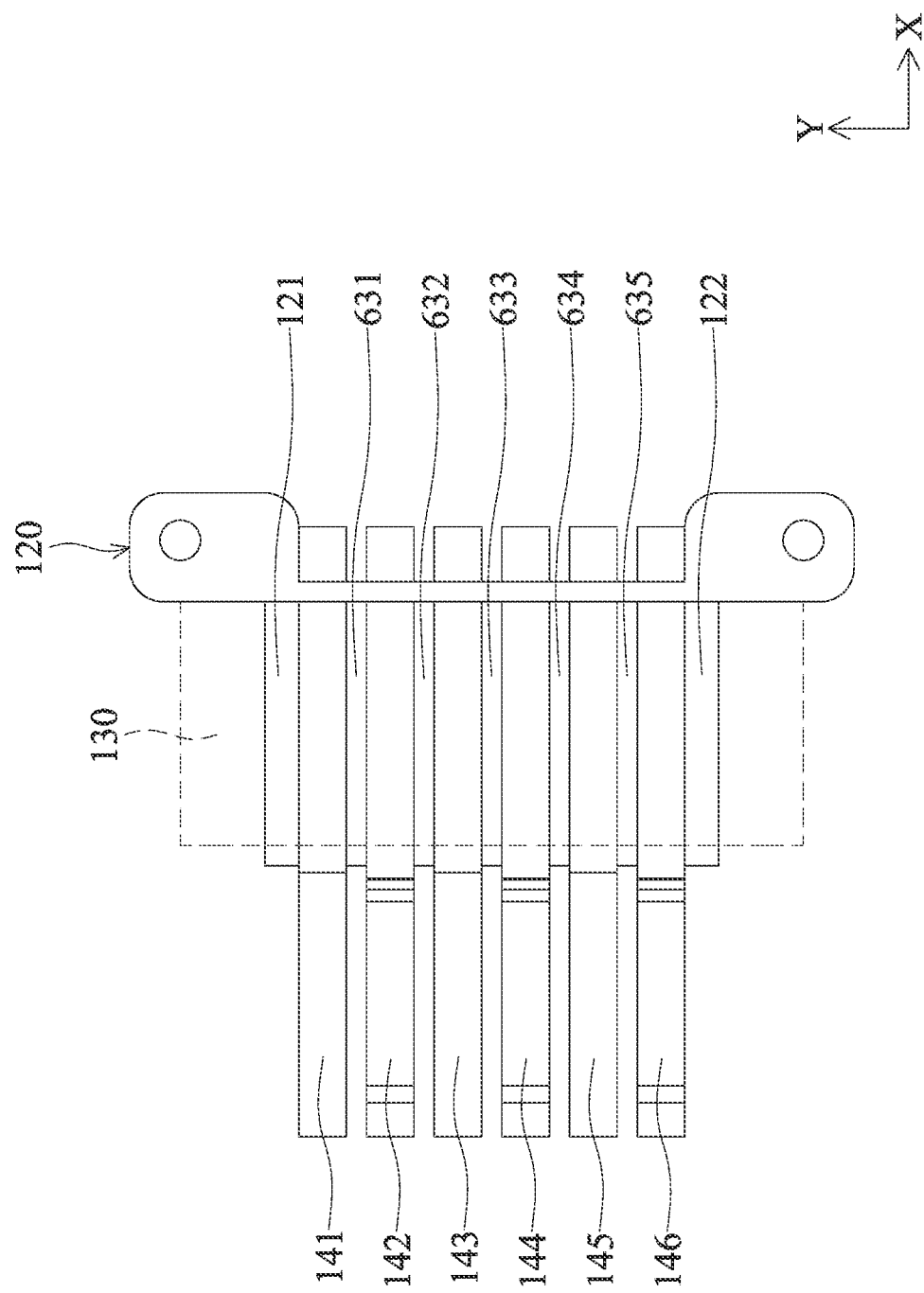

OPTICAL SYSTEM

CROSS REFERENCE TO RELATED APPLICATIONS

This application claims the benefit of U.S. Provisional Application No. 63/127,746, filed on Dec. 18, 2020, the entirety of which is incorporated by reference herein.

BACKGROUND OF THE INVENTION

Field of the Invention

The present disclosure relates to an optical system.

Description of the Related Art

As technology has developed, it has become more common to include image-capturing and video-recording functions into many types of modern electronic devices, such as smartphones and digital cameras. These electronic devices are used more and more often, and new models have been developed that are convenient, thin, and lightweight, offering more choice to consumers.

Electronic devices that have image-capturing or video-recording functions normally include a driving mechanism to drive an optical element (such as a lens) to move along its optical axis, thereby achieving auto focus (AF) or optical image stabilization (OIS). Light may pass through the optical element and may form an image on an optical sensor. However, the trend in modern mobile devices is to have a smaller size and a higher durability. As a result, how to effectively reduce the size of the driving mechanism and how to increase its durability has become an important issue.

BRIEF SUMMARY OF THE INVENTION

An optical system is provided. The optical system includes a first optical module, a fixed portion, and a driving module. The first optical module is used for connecting to a first optical element. The first optical module is movable relative to the fixed portion. The driving module is used for driving the first optical module to move relative to the fixed portion. The fixed portion includes an opening corresponding to the first optical module.

In some embodiments, the fixed portion includes a substrate. The driving module includes a bottom disposed on the substrate, a base disposed on the bottom, a coil affixed on the base, a magnetic conductive assembly corresponding to the coil and disposed on the base, and a magnetic element corresponding to the magnetic conductive assembly. The base includes plastic material.

In some embodiments, the coil includes a first segment extending along a first axis, and a second segment extending along a second axis. The magnetic conductive assembly includes a first magnetic conductive element being strip-shaped and including a first end and a second end, and a second magnetic conductive element being strip-shaped and including a third end and a fourth end. A coil axis of the coil is parallel to the second axis. The second axis is perpendicular to the first axis. A third axis is perpendicular to the first axis and the second axis. The first magnetic conductive element includes magnetic conductive material. The second magnetic conductive element includes magnetic conductive material. When viewed along the first axis, the first end does not overlap the second magnetic conductive element. When viewed along the first axis, the second end overlaps the second magnetic conductive element. When viewed along the first axis, the third end overlaps the first magnetic conductive element. When viewed along the first axis, the first end does not overlap the first magnetic conductive element. When viewed along the first axis, a distance between the first end and the coil is different from a distance between the second end and the coil. When viewed along the first axis, a distance between the third end and the coil is different from a distance between the fourth end and the coil. When viewed along the first axis, the magnetic element is between the first end and the fourth end. The fourth end and the base at least partially overlap each other in the direction that the second axis extends.

In some embodiments, the first magnetic conductive element includes a first magnetic conductive portion corresponding to the magnetic element, and a first portion connecting to the first magnetic conductive portion. The second magnetic conductive element includes: a second magnetic conductive portion corresponding to the magnetic element, a second portion connecting to the second magnetic conductive portion, a third portion connecting to the second portion, and a fourth portion connecting to the third portion. When viewed along the first axis, the first portion and the second portion do not overlap each other. When viewed along the first axis, the first portion and the third portion extend in different directions. When viewed along the first axis, the first portion at least partially overlaps the fourth portion. The coil surrounds the first portion and the fourth portion. When viewed along the first axis, the distance between the first end and the coil is greater than the distance between the third end and the coil. When viewed along the first axis, the distance between the second end and the coil is less than the distance between the fourth end and the coil. When viewed along the second axis, the first magnetic conductive element and the second magnetic conductive element do not overlap each other. When viewed along the third axis, the first magnetic conductive element and the second magnetic conductive element do not overlap each other. When viewed along the second axis, the first magnetic conductive element and the second segment do not overlap each other. When viewed along the second axis, the second magnetic conductive element at least partially overlaps the second segment.

In some embodiments, the magnetic conductive assembly further includes: a third magnetic conductive element being strip-shaped, and a fourth magnetic conductive element being strip-shaped. The third magnetic conductive element includes magnetic conductive material. The fourth magnetic conductive element includes magnetic conductive material. In the direction that the first axis extends, the first magnetic conductive element, the second magnetic conductive element, the third magnetic conductive element, and the fourth magnetic conductive element arrange sequentially. When viewed along the third axis, the first magnetic conductive element, the second magnetic conductive element, the third magnetic conductive element, and the fourth magnetic conductive element do not overlap each other. In the direction that the first axis extends, the first portion of the first magnetic conductive element at least partially overlaps the third magnetic conductive element. In the direction that the first axis extends, the first end of the first magnetic conductive element at least partially overlaps the third magnetic conductive element. In the direction that the first axis extends, the first end of the first magnetic conductive element does not overlap the fourth magnetic conductive element. In the direction that the first axis extends, the fourth end of the second magnetic conductive element at least partially overlaps the fourth magnetic conductive element. In the direction that the first axis extends, the fourth end of the second magnetic conductive element does not overlap the third magnetic conductive element.

In some embodiments, the base includes a supporting portion, a first positioning portion disposed on the supporting portion and used for supporting the coil, a second positioning portion disposed on the supporting portion and used for supporting the coil, a first opening position on the supporting portion and used for accommodating the first magnetic conductive element, a second opening position on the supporting portion and used for accommodating the second magnetic conductive element, and a first isolating portion between the first opening and the second opening. The coil is wound on the first positioning portion and the second positioning portion. The first opening is between the first positioning portion and the second positioning portion. The first positioning portion is between the first segment and the second segment of the coil. The second positioning portion is between the first segment and the second segment of the coil. The first isolating portion is between the first segment and the second segment of the coil. The first isolating portion is between the first positioning portion and the second positioning portion. When viewed along the third axis, at least a portion of the first positioning portion is exposed from the coil. When viewed along the third axis, at least a portion of the second positioning portion is exposed from the coil. When viewed along the third axis, at least a portion of the first isolating portion is exposed from the coil. In the direction that the first axis extends, the width of the first positioning portion is different from the width of the first isolating portion. In the direction that the first axis extends, the width of the second positioning portion is different from the width of the first isolating portion.

In some embodiments, the optical system further includes a connecting assembly, wherein the driving module is connected to the first optical module through the connecting assembly, and the connecting assembly includes a first connecting element rotatably connected to the bottom, a second connecting element affixed on the first connecting element, a third connecting element movably connected to the second connecting element, and a fourth connecting element movably connected to the third connecting element. The fixed portion further includes a case affixed on the substrate, and a top plate affixed on the case. An accommodating space is formed between the top plate and the case. The first optical module is disposed between the accommodating space. The second connecting element is affixed on the magnetic element. At least a portion of the second connecting element is disposed in the accommodating space. The third connecting element is disposed in the accommodating space. The fourth connecting element is disposed in the accommodating space. The fourth connecting element includes a first position limiting portion and a second position limiting portion. The first position limiting portion includes a first stopping surface. The second position limiting portion includes a third stopping surface.

In some embodiments, the case includes a first recess portion, a second recess portion, and a third recess portion. The first position limiting portion is disposed in the first recess portion. The second position limiting portion is disposed in the second recess portion. The first recess portion includes a second stopping surface directly facing the first stopping surface. The second recess portion includes a fourth stopping surface directly facing the third stopping surface. The first stopping surface and the third connecting element are at opposite sides of the fourth connecting element. The third connecting element is disposed in the third recess portion. The first stopping surface and the second stopping surface are parallel. The third stopping surface and the fourth stopping surface are parallel.

In some embodiments, the first stopping surface, the second stopping surface, the third stopping surface, and the fourth stopping surface are parallel to the third axis. The second connecting element includes a first connecting hole being strip-shaped. The fourth connecting element includes a second connecting hole being strip-shaped. The third connecting element passes through the first connecting hole and the second connecting hole. The third connecting element is slidable in the first connecting hole and the second connecting hole. When viewed along the first axis, at least a portion of the first connecting hole overlaps the second connecting hole. The material of the third connecting element includes metal.

In some embodiments, the optical system further includes a first positioning magnetic element disposed on the fixed portion, a second positioning magnetic element disposed on the fixed portion, a third positioning magnetic element disposed on the fixed portion, and a first sealing element disposed on the fixed portion. The third connecting element is magnetic conductive. The distance between the first positioning magnetic element and the substrate, the distance between the second positioning magnetic element and the substrate, and the distance between the third positioning magnetic element and the substrate are different. A sealed space is formed between the first sealing element and the fixed portion used for sealing the first optical module.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIG. 4C is a schematic view of some elements of the driving module.

DETAILED DESCRIPTION OF THE INVENTION

Figure 1A:
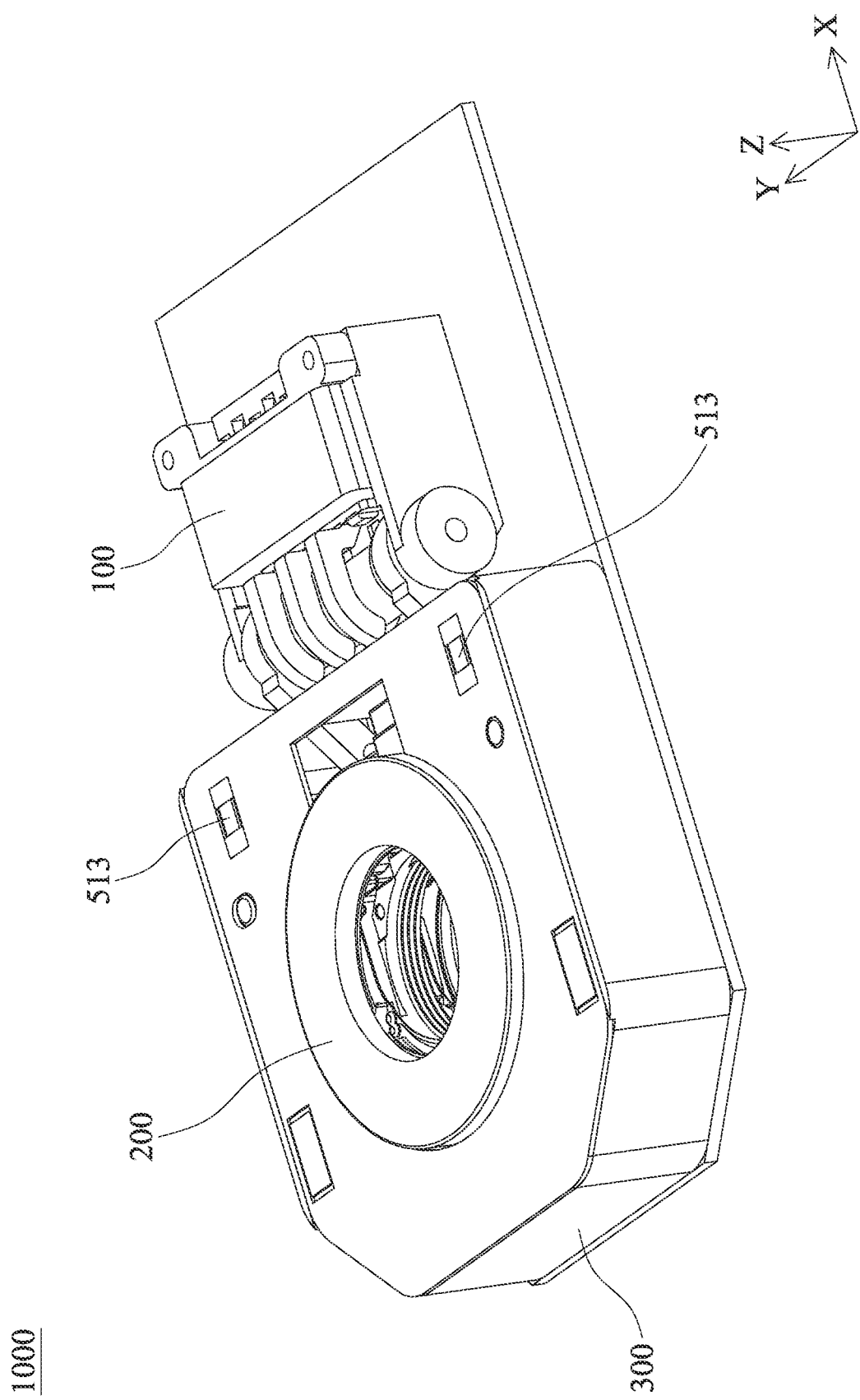
FIG. 1A is a schematic view of an optical system in some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, in some embodiments, the formation of a first feature over or on a second feature in the description that follows may include embodiments in which the first and second features are in direct contact, and may also include embodiments in which additional features may be disposed between the first and second features, such that the first and second features may not be in direct contact.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are in direct contact, and may also include embodiments in which additional features may be disposed interposing the features, such that the features may not be in direct contact. In addition, spatially relative terms, for example, "vertical," "above," "over," "below,", "bottom," etc. as well as derivatives thereof (e.g., "downwardly," "upwardly," etc.) are used in the present disclosure for ease of description of one feature's relationship to another feature. The spatially relative terms are intended to cover different orientations of the device, including the features.

Unless defined otherwise, all technical and scientific terms used herein have the same meaning as commonly understood by one of ordinary skill in the art to which this disclosure belongs. It should be appreciated that each term, which is defined in a commonly used dictionary, should be interpreted as having a meaning conforming to the relative skills and the background or the context of the present disclosure, and should not be interpreted in an idealized or overly formal manner unless defined otherwise.

Use of ordinal terms such as "first", "second", etc., in the claims to modify a claim element does not by itself connote any priority, precedence, or order of one claim element over another or the temporal order in which acts of a method are performed, but are used merely as labels to distinguish one claim element having a certain name from another element having the same name (but for use of the ordinal term) to distinguish the claim elements.

In addition, in some embodiments of the present disclosure, terms concerning attachments, coupling and the like, such as "connected" and "interconnected", refer to a relationship wherein structures are secured or attached to one another either directly or indirectly through intervening structures, as well as both movable or rigid attachments or relationships, unless expressly described otherwise.

Figure 1B:
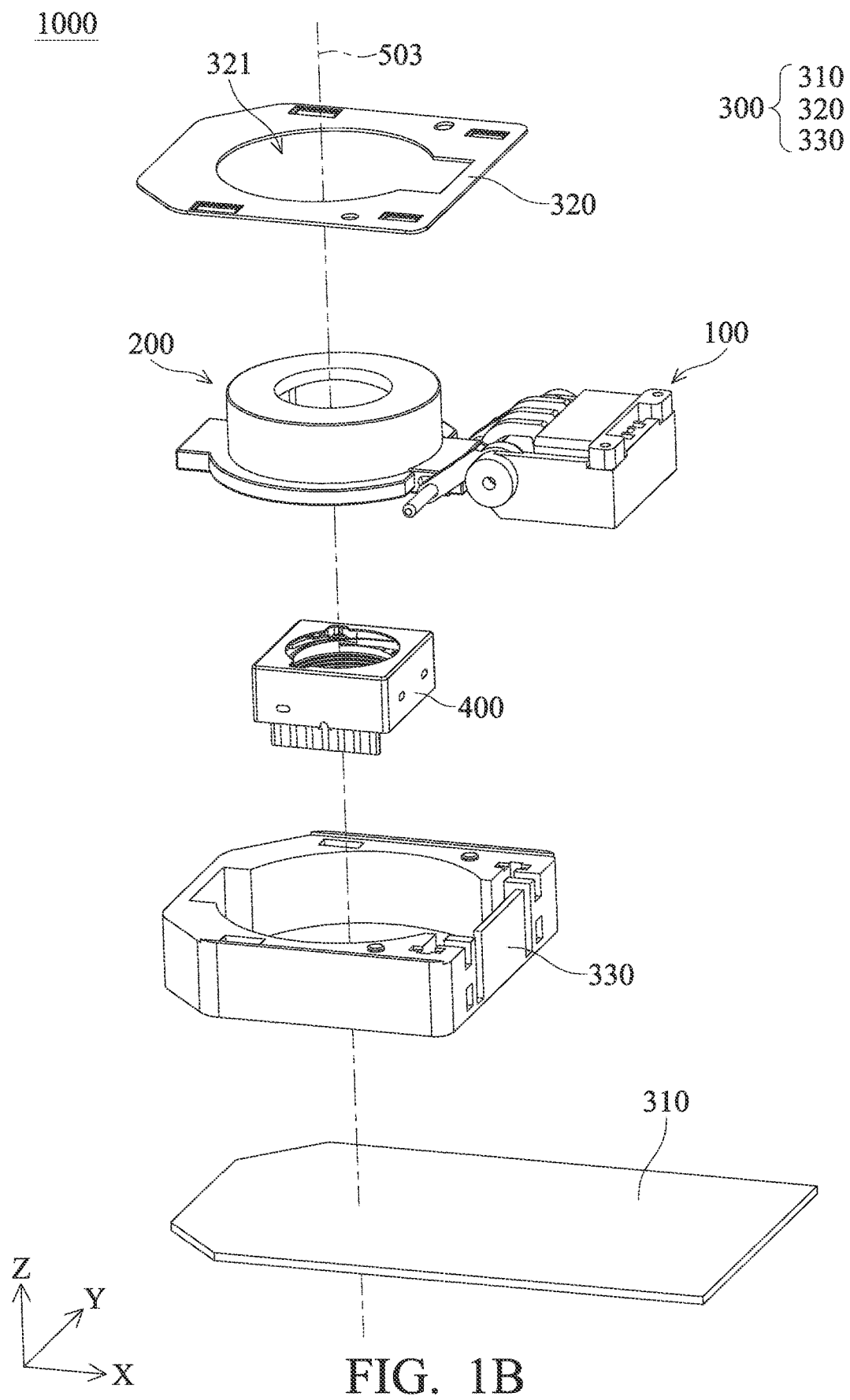
FIG. 1B is an exploded view of the optical system.
Figure 1C:
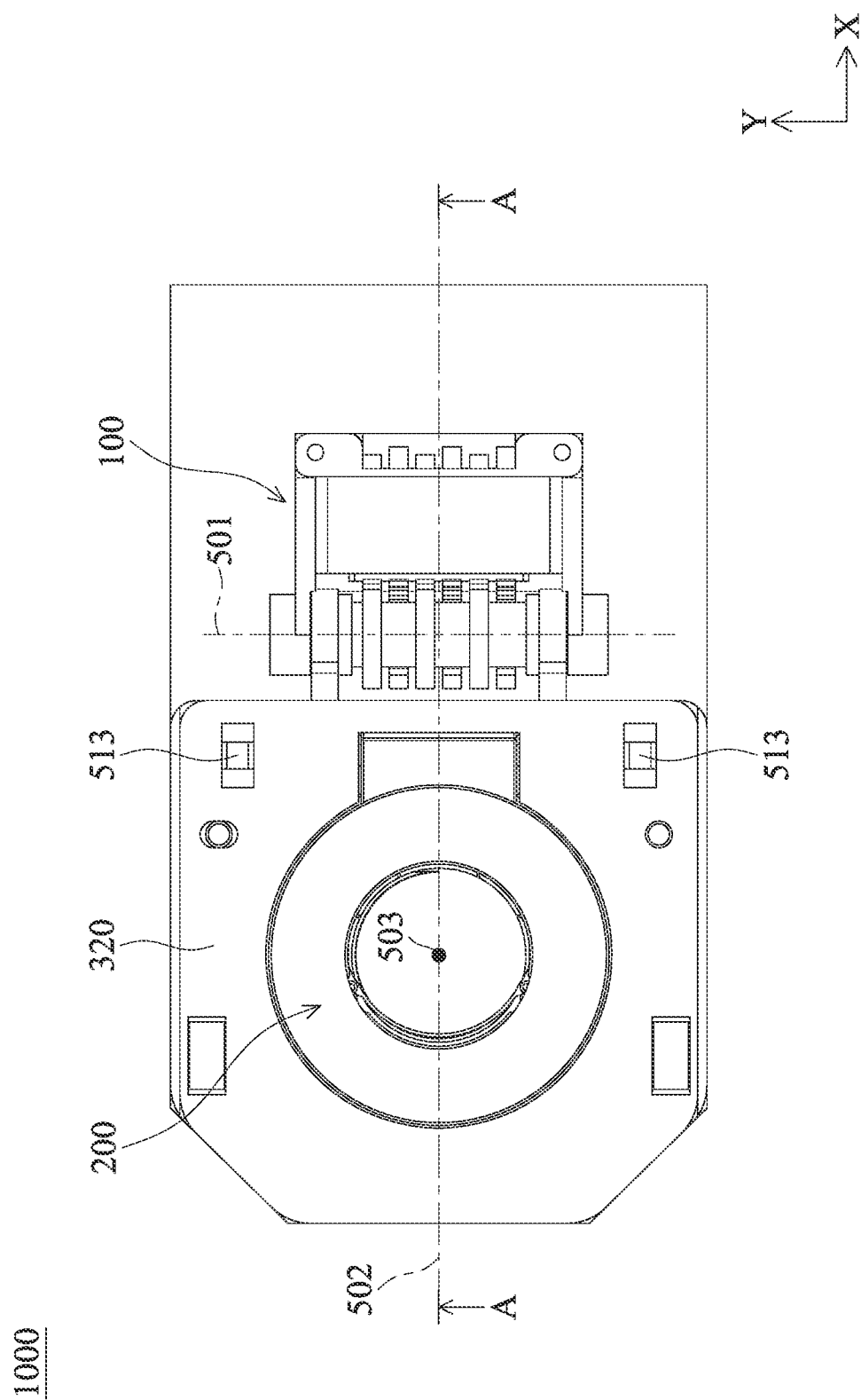
FIG. 1C is a top view of the optical system.
Figure 1D:
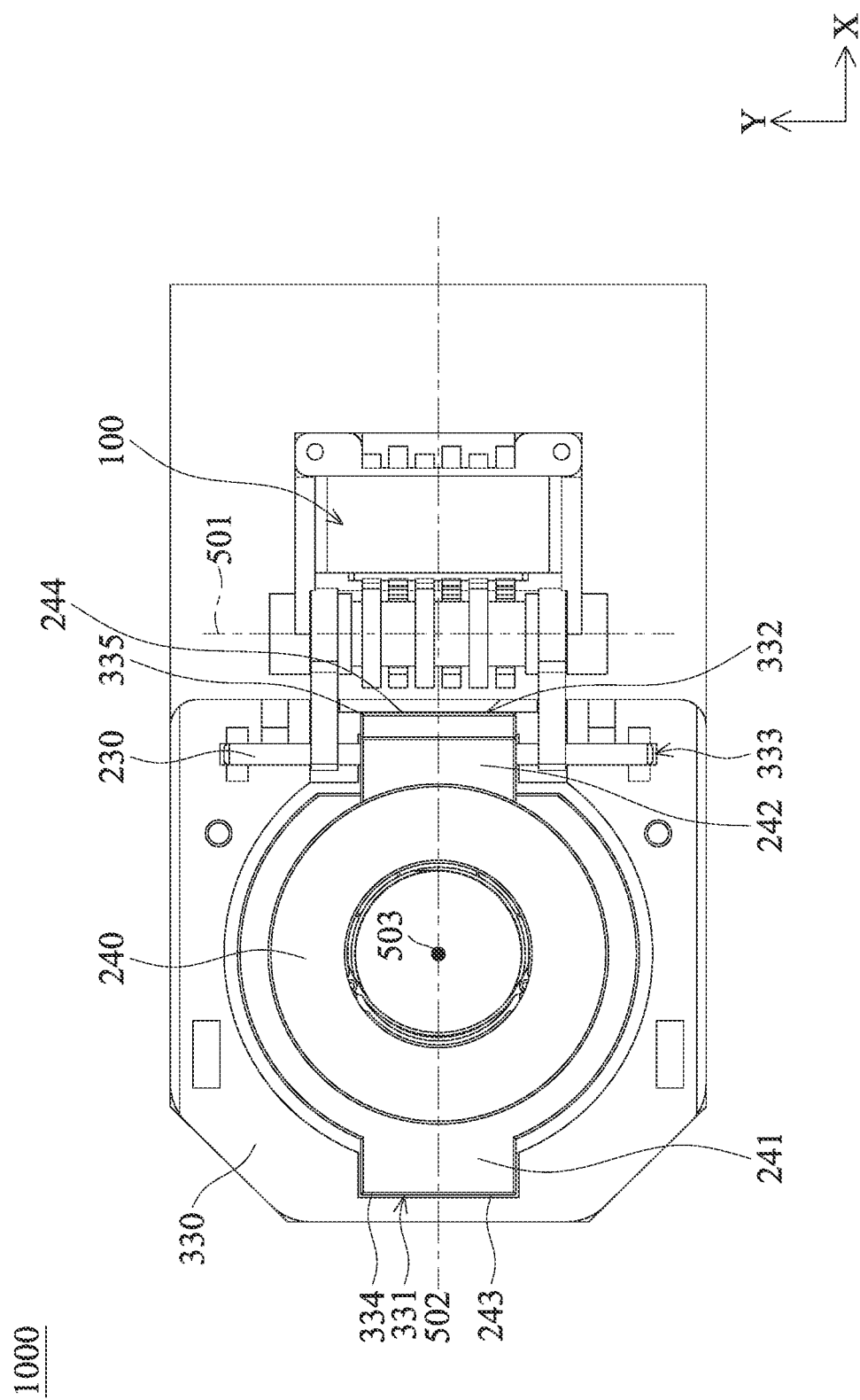
FIG. 1D is a top view of some elements of the optical system.
Figure 1E:
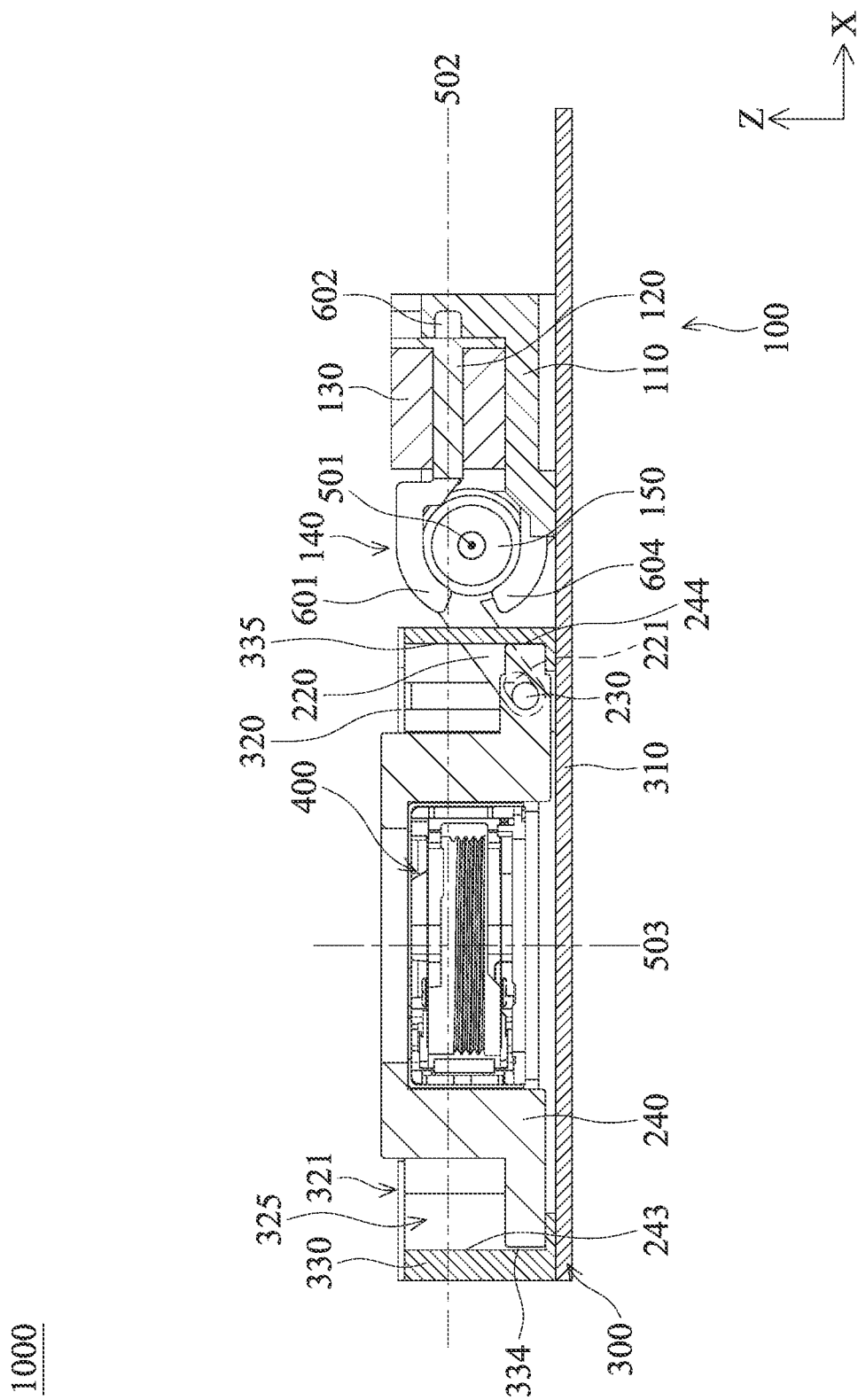
FIG. 1E is a cross-sectional view illustrated along the second axis in FIG. 1C.

Refer to FIG. 1A to FIG. 1E. FIG. 1A is a schematic view of an optical system 1000 in some embodiments of the present disclosure. FIG. 1B is an exploded view of the optical system 1000. FIG. 1C is a top view of the optical system 1000. FIG. 1D is a top view of some elements of the optical system 1000. FIG. 1E is a cross-sectional view illustrated along the second axis 502 in FIG. 1C.

As shown in FIG. 1A to FIG. 1E, the optical system 1000 mainly includes a driving module 100, a connecting assembly 200, a fixed portion 300, and a first optical module 400. In some embodiments, the fixed portion 300 may include a substrate 310, a top plate 320, and a case 330. The driving module 100 and the case 330 may be disposed on the substrate 310. The first optical module 400 may be disposed in the case 330. The top plate 320 may be disposed on the fixed portion 300 and forms an accommodating space 325 with the case 330. The first optical module 400 may be disposed in the accommodating space 325. An opening 321 may be formed on the top plate 320 and correspond to the first optical module 400, such as a portion of the first optical module 400 may be exposed from the opening 321.

The first optical module 400 may be used for connecting to a first optical element (not shown). For example, the first optical module 400 may be an optical element driving mechanism, such as may be used for auto focus (AF) or optical image stabilization (OIS). The optical element may be a lens, a mirror, a prism, a beam splitter, an aperture, a liquid lens, an image sensor, a camera module, or a ranging module. It should be noted that the definition of the optical element is not limited to the element that is related to visible light, and other elements that relate to invisible light (e.g. infrared or ultraviolet) are also included in the present disclosure.

Figure 2A:
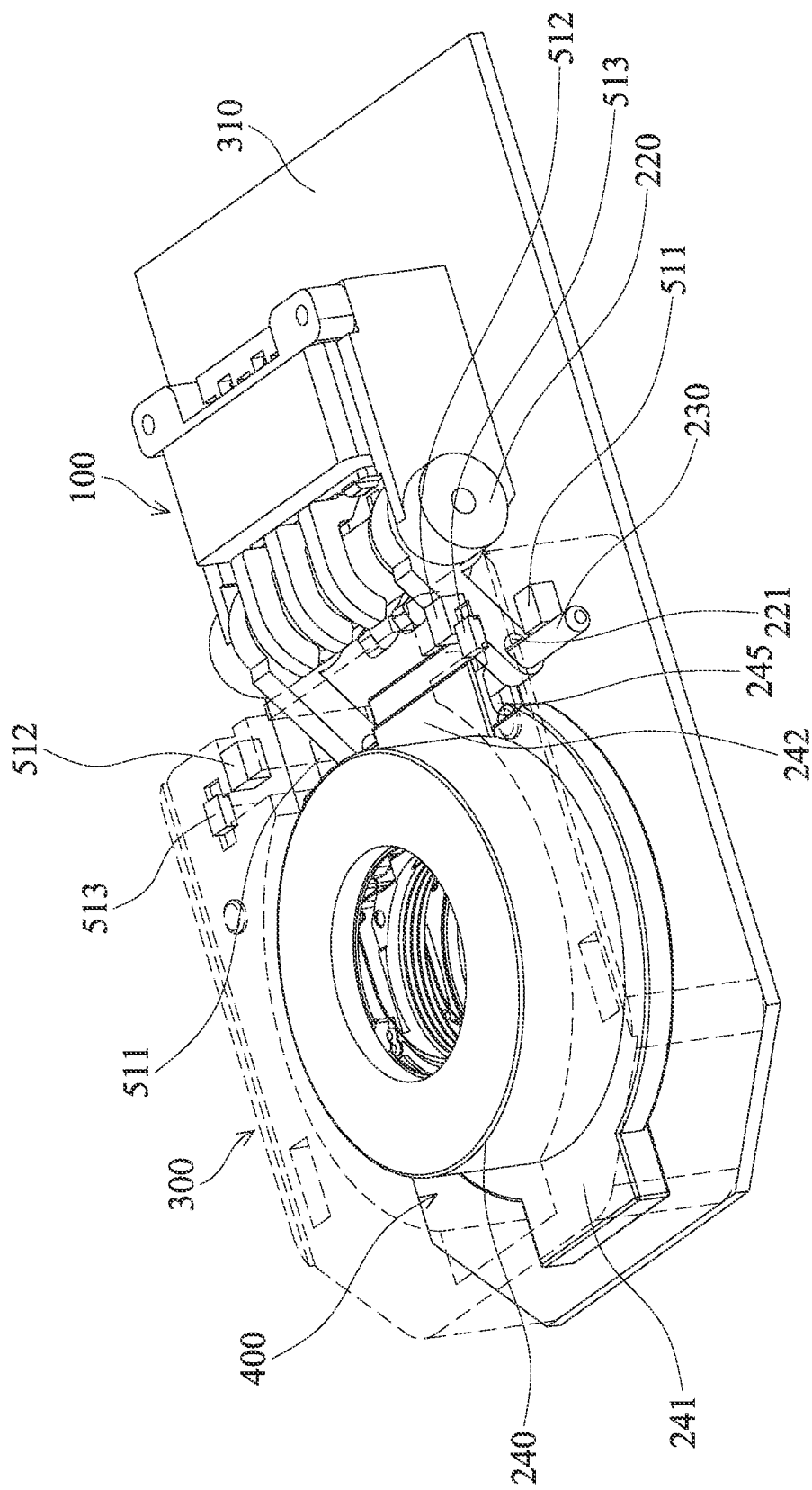
FIG. 2A is a schematic view of some elements of the optical system
Figure 2B:
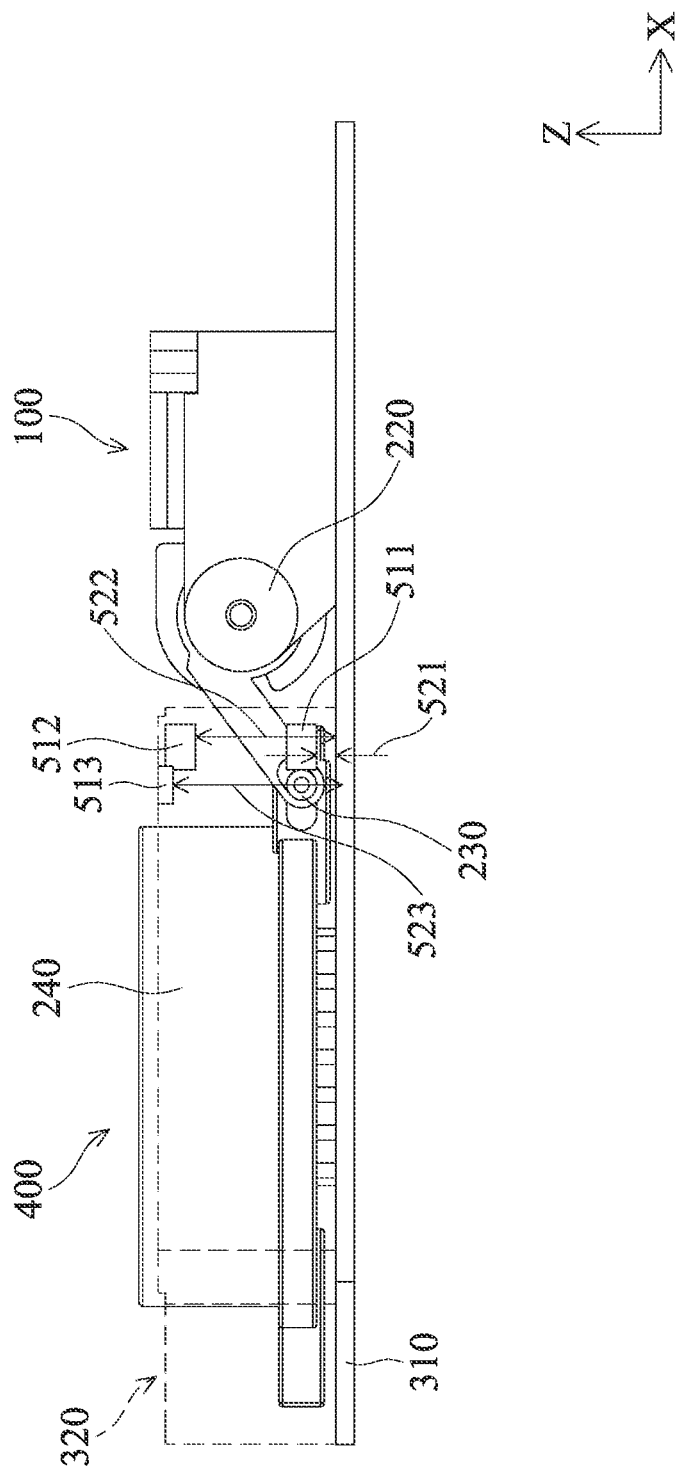
FIG. 2B is a schematic view of some elements of the optical system
Figure 3:
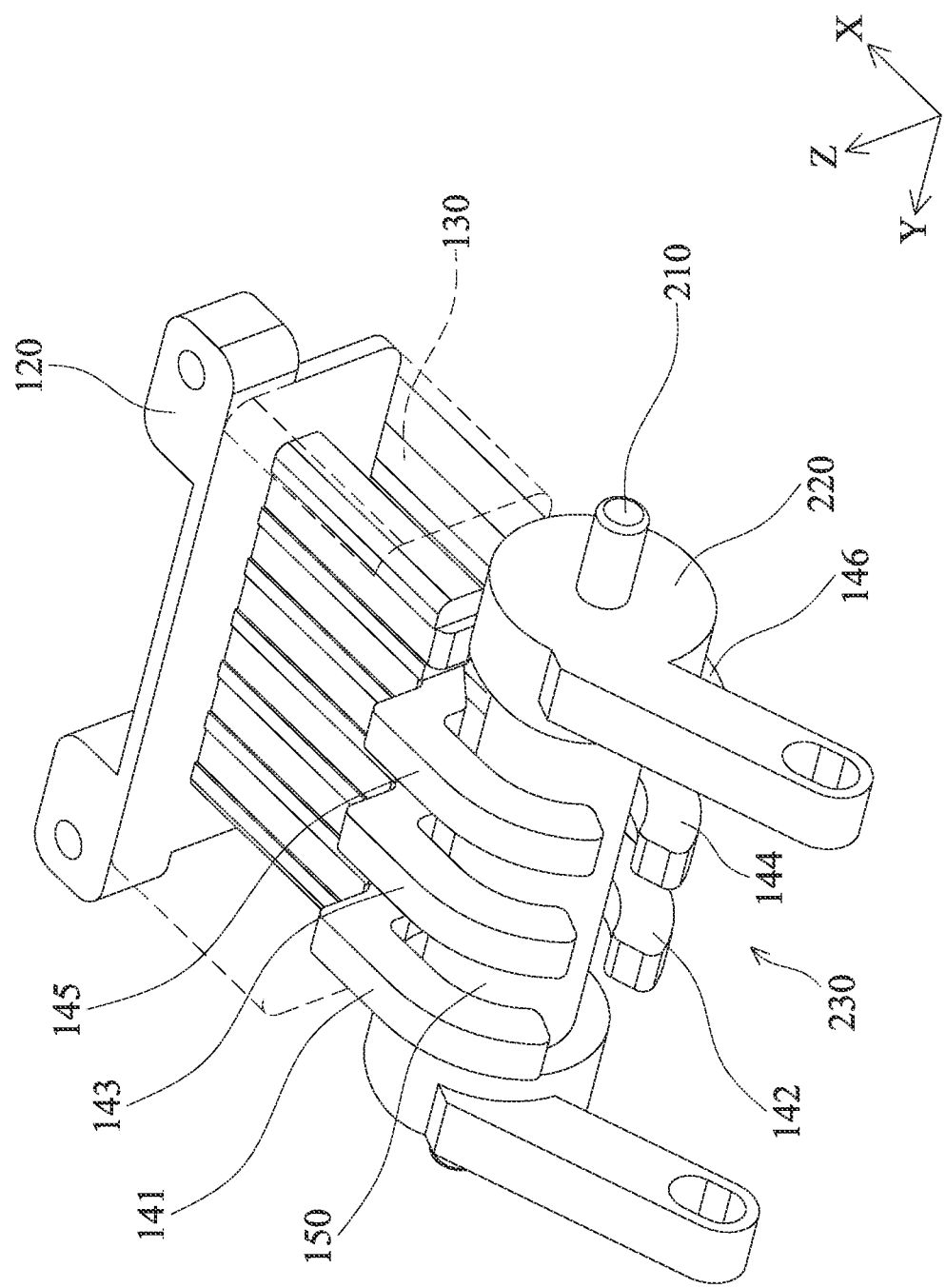
FIG. 3 is a schematic view of some elements of the driving module and the connecting assembly.

The driving module 100 may be used for driving the first optical module 400 to move relative to the fixed portion 300. For example, the driving module 100 may connect to the first optical module 400 through the connecting assembly 200 to allow the first optical module 400 to move. For example, FIG. 2A and FIG. 2B are schematic views of some elements of the optical system 1000, wherein other elements of the fixed portion 300 are shown. FIG. 3 is a schematic view of some elements of the driving module 100 and the connecting assembly 200. As shown in FIG. 1E and FIG. 3, the driving module 100 may include a bottom 110, a base 120, a coil 130, a magnetic conductive assembly 140, and a magnetic element 150. The connecting assembly 200 may include a first connecting element 210, a second connecting element 220, a third connecting element 230, and a fourth connecting element 240.

The bottom 110 may be affixed on the substrate 310. The base 120 may be affixed on the bottom 110. The coil 130 may be affixed on the base 120. The magnetic conductive assembly 140 may be disposed on the base 120 and correspond to the coil 130. In some embodiments, the magnetic element 150 may correspond to the magnetic conductive assembly 140. In some embodiments, an axis passing through the center of the magnetic element 150 may be defined as a first axis 501, an axis parallel to a coil axis of the coil 130 (e.g. an axis passing through the center of the coil 130) may be defined as a second axis 502, and an axis passing through the center of the first optical module 400 may be defined as the third axis 503. The first axis 501, the second axis 502, and the third axis 503 may be perpendicular to each other.

Figure 4A:
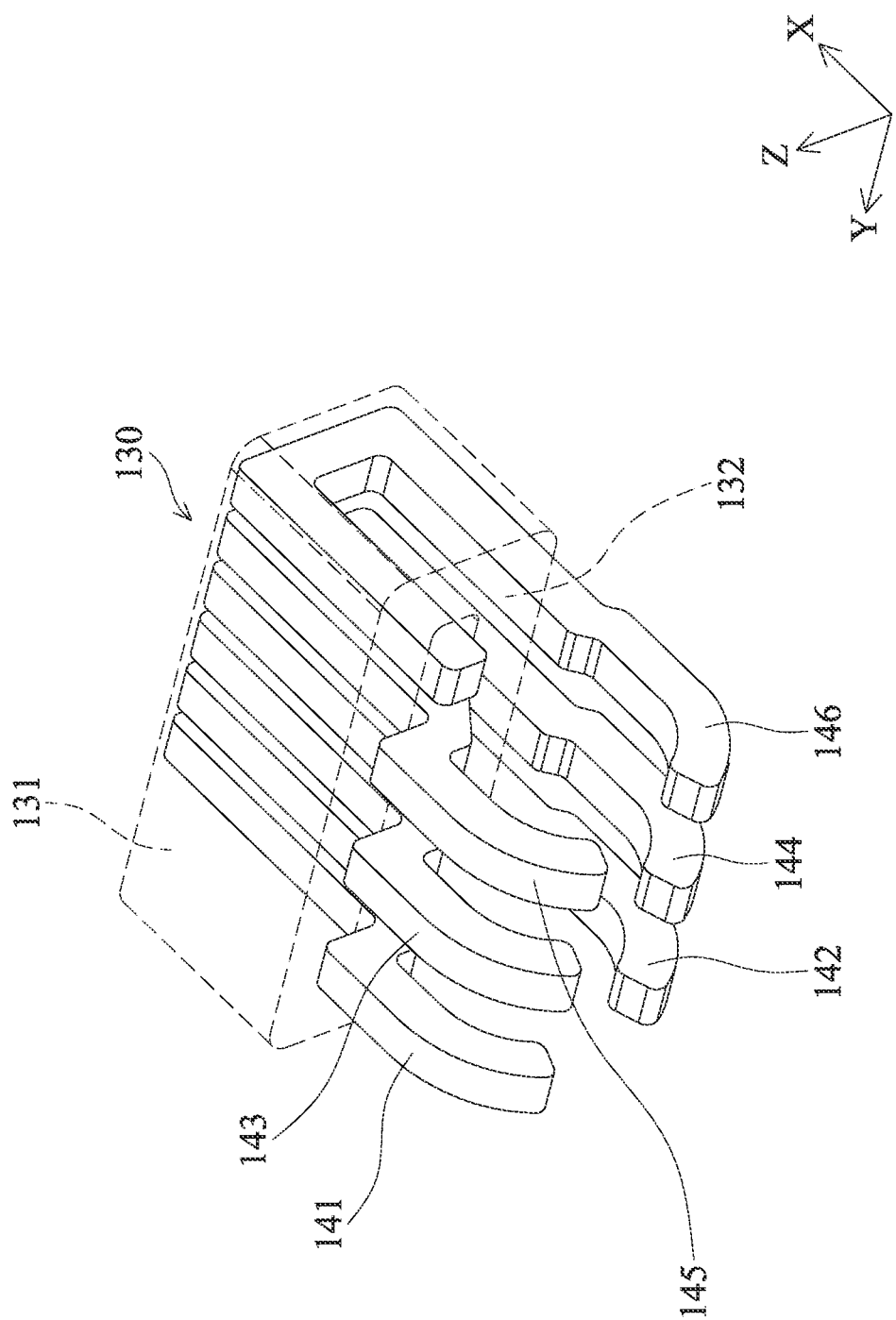
FIG. 4A is a schematic view of some elements of the driving module.
Figure 4B:
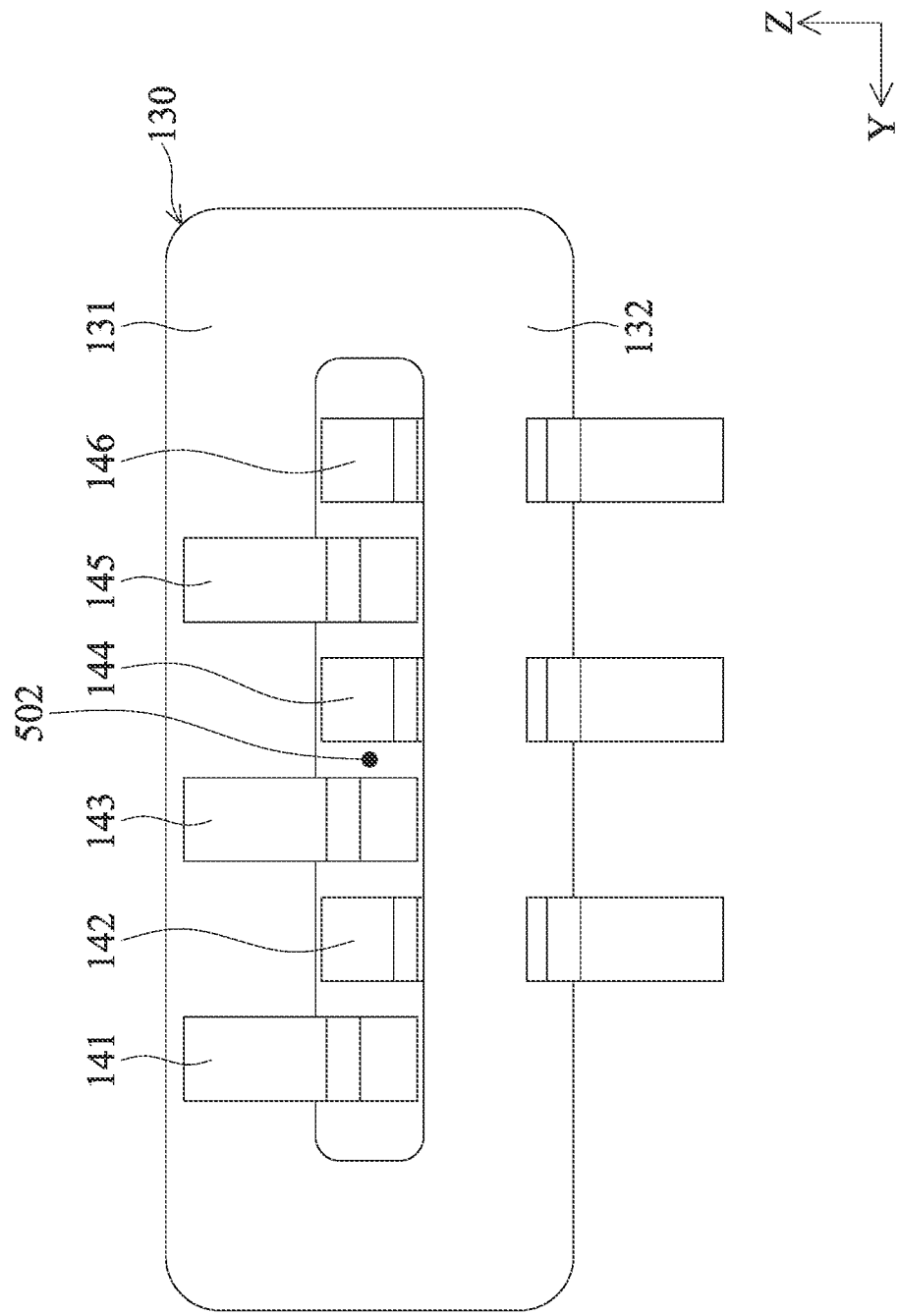
FIG. 4B is a schematic view of some elements of the driving module.
Figure 4D:
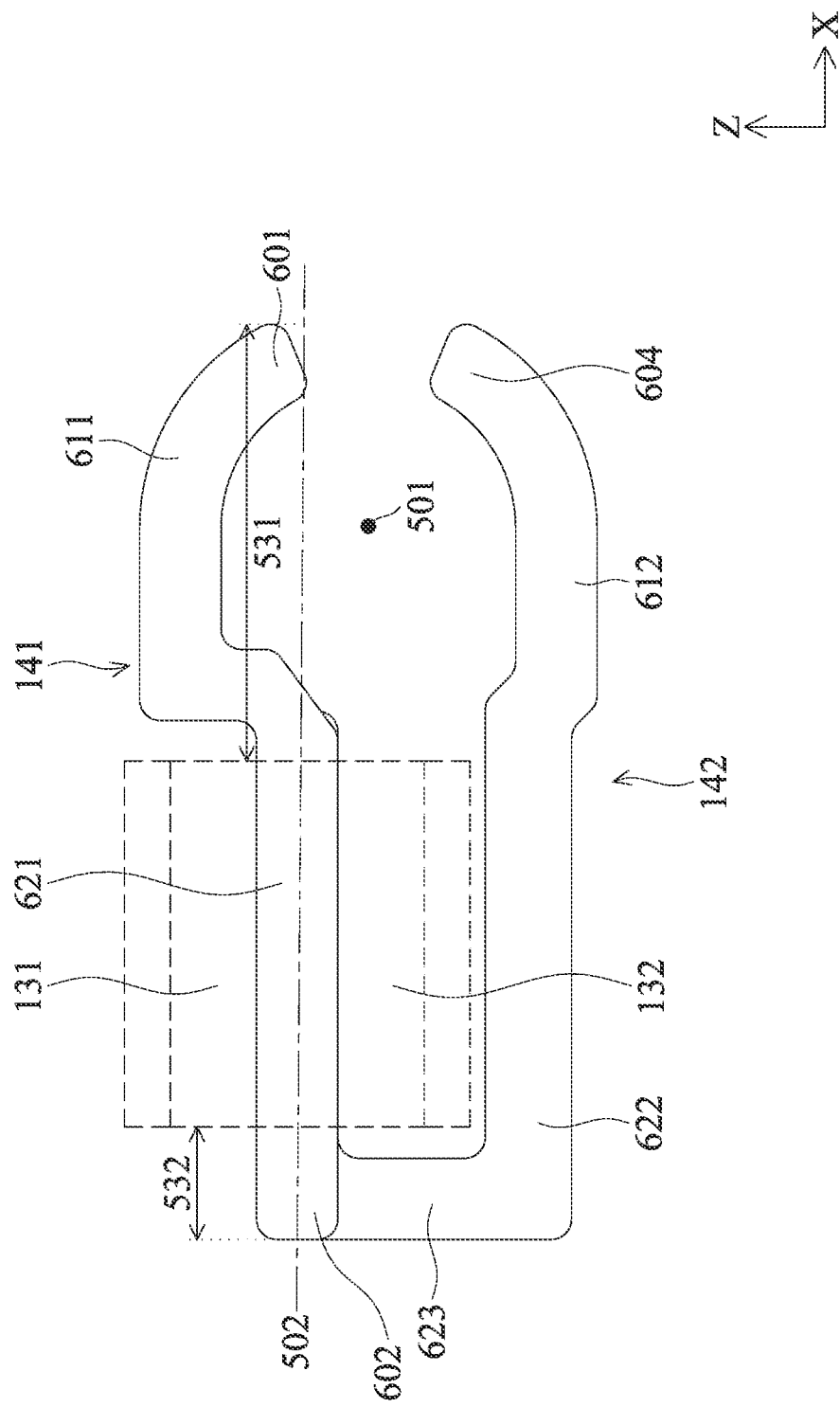
FIG. 4D is a schematic view of some elements of the driving module.
Figure 4E:
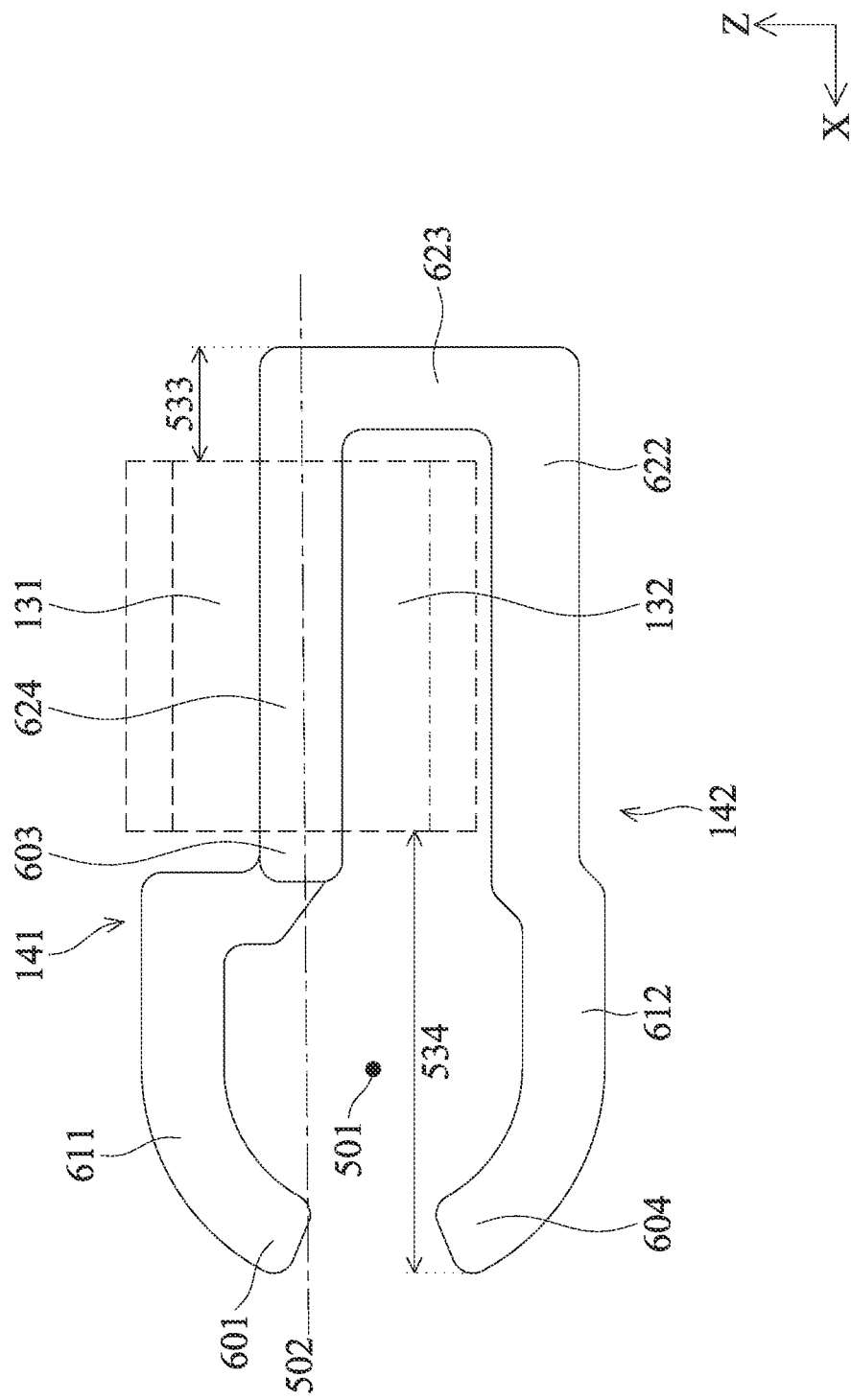
FIG. 4E is a schematic view of some elements of the driving module.
Figure 5:
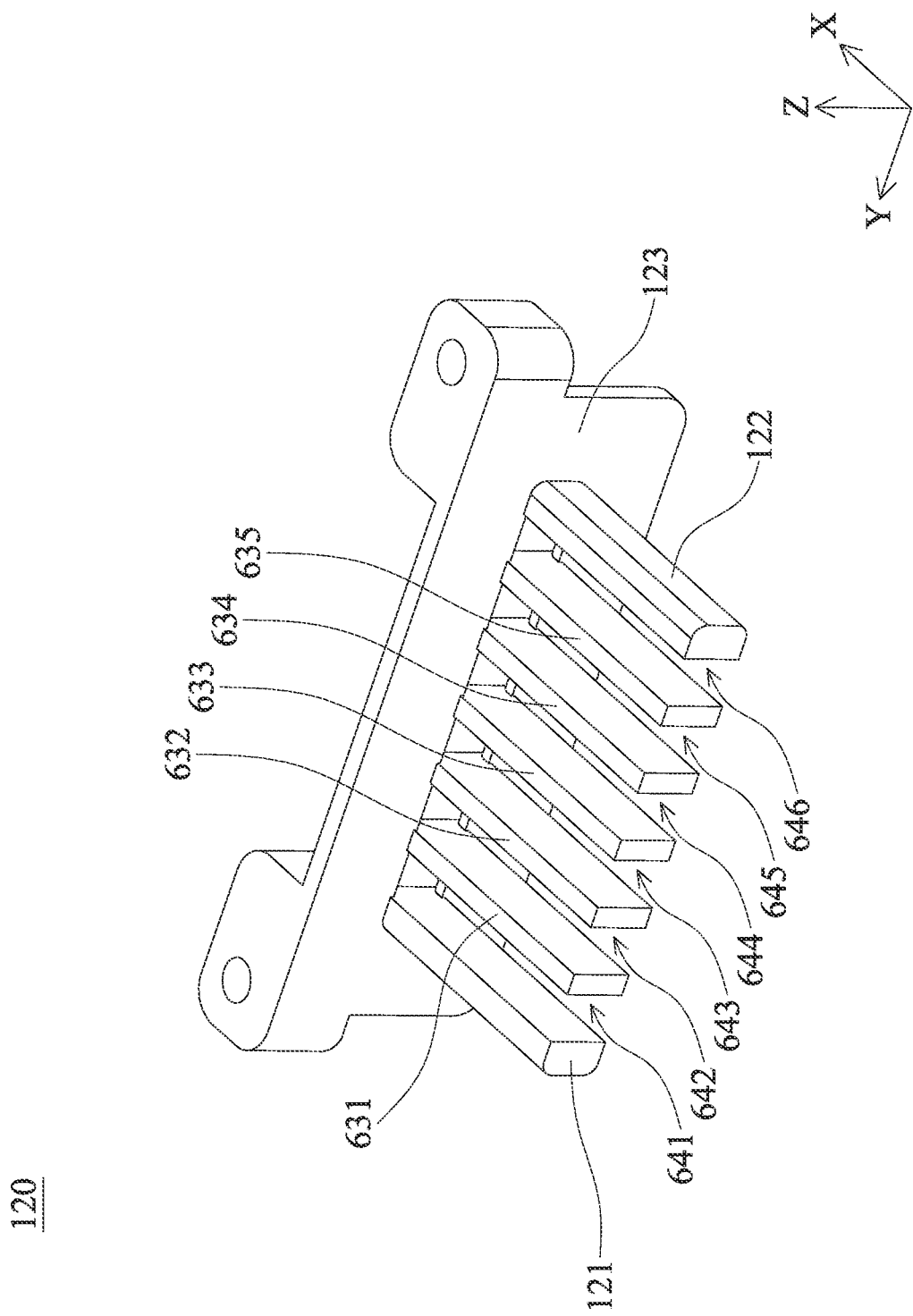
FIG. 5 is a schematic view of the base.
Figure 6A:
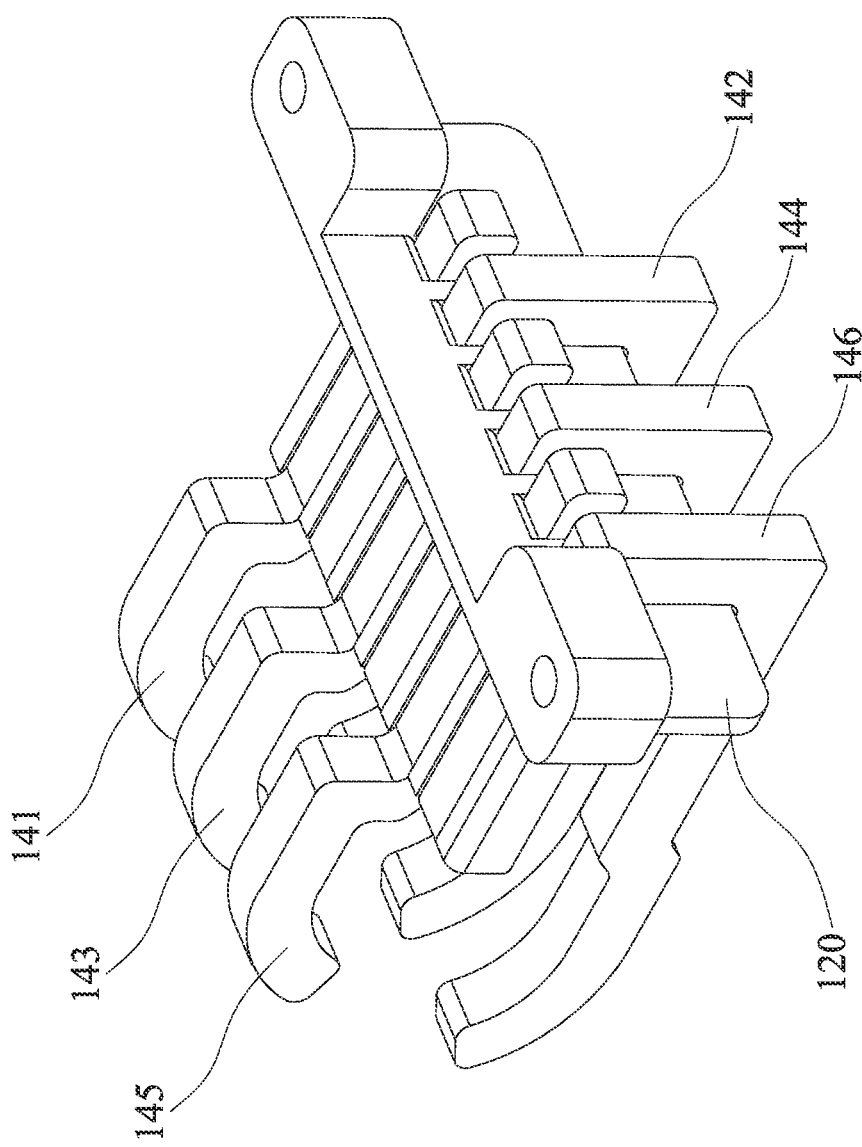
FIG. 6A is a schematic view of some elements of the driving module.
Figure 6B:
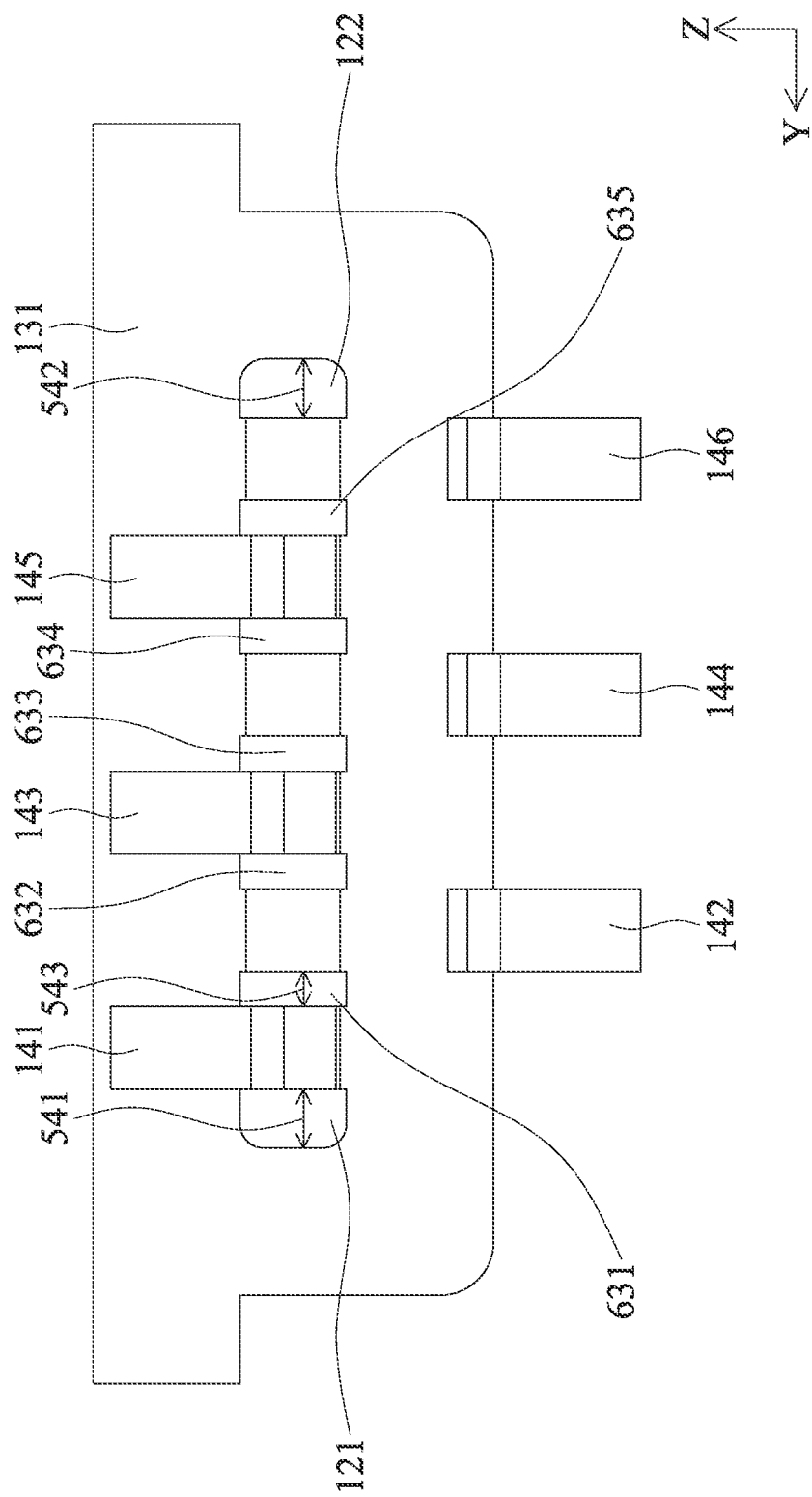
FIG. 6B is a schematic view of some elements of the driving module.

FIG. 4A, FIG. 4B, FIG. 4C, FIG. 4D, and FIG. 4E are schematic views of some elements of the driving module 100. FIG. 5 is a schematic view of the base 120. FIG. 6A and FIG. 6B are schematic views of some elements of the driving module 100. As shown in FIG. 5, the base 120 may include a first positioning portion 121 and a second positioning portion 122 disposed on a supporting portion 123. The first positioning portion 121, the second positioning portion 122, and the supporting portion 123 may be used for supporting the coil 130.

Moreover, a first isolating portion 631, a second isolating portion 632, a third isolating portion 633, a fourth isolating portion 634, and a fifth isolating portion 635 may be sequentially disposed between the first positioning portion 121 and the second positioning portion 122. A first opening 641 may be defined between the first positioning portion 121 and the first isolating portion 631, a second opening 642 may be defined between the second positioning portion 122 and the second isolating portion 632, a third opening 643 may be defined between the second isolating portion 632 and the third isolating portion 633, a fourth opening 644 may be defined between the third isolating portion 633 and the fourth isolating portion 634, a fifth opening 645 may be defined between the fourth isolating portion 634 and the fifth isolating portion 635, and a sixth opening 646 may be defined between the fifth isolating portion 635 and the second positioning portion 122 in some embodiments.

In some embodiments, the magnetic conductive assembly 140 may include a first magnetic conductive element 141, a second magnetic conductive element 142, a third magnetic conductive element 143, a fourth magnetic conductive element 144, a fifth magnetic conductive element 145, and a sixth magnetic conductive element 146, which are disposed in the first opening 641, the second opening 642, the third opening 643, the fourth opening 644, the fifth opening 645, and the sixth opening 646, respectively. In some embodiments, the first magnetic conductive element 141, the third magnetic conductive element 143, and the fifth magnetic conductive element 145 may have identical or similar shapes, and the second magnetic conductive element 142, the fourth magnetic conductive element 144, and the sixth magnetic conductive element 146 may have identical or similar shapes. Moreover, the first magnetic conductive element 141, the second magnetic conductive element 142, the third magnetic conductive element 143, the fourth magnetic conductive element 144, the fifth magnetic conductive element 145, and the sixth magnetic conductive element 146 may be strip-shaped and magnetic conductive to guide the magnetic field generated by the coil 130 or the magnetic element 150 in some embodiments.

The coil 130 may be wound on the first positioning portion 121 and the second positioning portion 122 to surround the first magnetic conductive element 141, the second magnetic conductive element 142, the third magnetic conductive element 143, the fourth magnetic conductive element 144, the fifth magnetic conductive element 145, and the sixth magnetic conductive element 146. For example, in some embodiments, the coil 130 may include a first segment 131 and a second segment 132 extending along the direction of the first axis 501 extends, and the first positioning portion 121, the second positioning portion 122, the first magnetic conductive element 141, the second magnetic conductive element 142, the third magnetic conductive element 143, the fourth magnetic conductive element 144, the fifth magnetic conductive element 145, the sixth magnetic conductive element 146, the first isolating portion 631, the second isolating portion 632, the third isolating portion 633, the fourth isolating portion 634, and the fifth isolating portion 635 may position between the first segment 131 and the second segment 132.

When viewed along the third axis 503, as shown in FIG. 4C, the first positioning portion 121, the second positioning portion 122, the first isolating portion 631, the second isolating portion 632, the third isolating portion 633, the fourth isolating portion 634, and the fifth isolating portion 635 may be at least partially exposed from the coil 130. In other words, the lengths of the first positioning portion 121, the second positioning portion 122, the first isolating portion 631, the second isolating portion 632, the third isolating portion 633, the fourth isolating portion 634, and the fifth isolating portion 635 may be greater than the thickness of the coil 130.

Moreover, as shown in FIG. 6B, in the direction that the first axis 501 extends, the width 541 of the first positioning portion 121 is different from the width 543 of the first isolating portion 631. For example, the width 541 may be greater than the width 543, the width of the second positioning portion 542 may be greater than the width 543, and the width 541 and the width 542 may be substantially identical. Therefore, the mechanical strength of the first positioning portion 121 and the second positioning portion 122 may be increased to allow the coil 130 be wound on the first positioning portion 121 and the second positioning portion 122 in some embodiments.

Because the shapes of the first magnetic conductive element 141, the third magnetic conductive element 143, and the fifth magnetic conductive element 145 may be identical or similar, and the shapes of the second magnetic conductive element 142, the fourth magnetic conductive element 144, and the sixth magnetic conductive element 146 may be identical or similar, the detail of the structures of the magnetic conductive elements are illustrated by using the first magnetic conductive element 141 and the second magnetic conductive element 142 are an example. In some embodiments, as shown in FIG. 4D and FIG. 4E, when viewed along the first axis 501, the first magnetic conductive element 141 may be strip-shaped, and may include a first magnetic conductive portion 611 and a first portion 621 connected with each other. In some embodiments, the first magnetic conductive portion 611 has a first end 601, and the first portion 621 has a second end 602. In some embodiments, when viewed along the first axis 501, the second magnetic conductive element 142 may be strip-shaped, and may have a second magnetic conductive portion 612, a second portion 622, a third portion 623, and a fourth portion 624 sequentially connect to each other.

In some embodiments, when viewed along the first axis 501, the first end 601 and the second magnetic conductive element 142 do not overlap each other, the second end 602 overlaps the second magnetic conductive element 142, the third end 603 overlaps the first magnetic conductive element 141, and the fourth end 604 does not overlap the first magnetic conductive element 141. The fourth end 604 and the base 120 at least partially overlap each other in a direction that the first axis 501 extends. In some embodiments, the distance 531 between the first end 601 and the coil 130 is different from the distance 532 between the second end 602 and the coil 130, the distance 533 between the third end 603 and the coil 130 is different from the distance 534 between the fourth end 604 and the coil 130. For example, the distance 531 may be greater than the distance 532, and the distance 533 may be less than the distance 534. In some embodiments, the distance 532 and the distance 533 may be substantially identical, and the distance 531 and the distance 534 may be substantially identical. Therefore, the size of the driving module 100 in specific directions may be decreased to achieve miniaturization.

In some embodiments, when viewed along the first axis 501, the first portion 621 and the second portion 622 do not overlap each other. The directions that the first portion 621 and the third portion 623 extend are not identical, the first portion 621 and the fourth portion 624 at least partially overlap each other, and the second portion 622 and the third portion 623 are outside the coil 130. Therefore, the magnetic field generated by the coil 130 may induct with the first portion 621 and the fourth portion 624, and then transfer to the first magnetic conductive portion 611 and the second magnetic conductive portion 612 (the second magnetic conductive element 142 may use the second portion 622 and the third portion 623 for transferring).

The magnetic element 150 may be disposed between the first magnetic conductive portion 611 and the second magnetic conductive portion 612, such as may dispose between the first end 601 and the fourth end 604 to allow the first magnetic conductive portion 611 and the second magnetic conductive portion 612 correspond to the magnetic element 150. Therefore, magnetic field with different directions may be induced by the first magnetic conductive portion 611 and the second magnetic conductive portion 612 to the magnetic element 150, and the magnitude and the direction of the electromagnetic force may be controlled to control the rotation of the magnetic element 150 in some embodiments.

In some embodiments, when viewed along the second axis 502 or the third axis 503, the first magnetic conductive element 141, the second magnetic conductive element 142, the third magnetic conductive element 143, the fourth magnetic conductive element 144, the fifth magnetic conductive element 145, and the sixth magnetic conductive element 146 may arrange sequentially and do not overlap each other. In some embodiments, when viewed along the second axis 502, the first magnetic conductive element 141 and the second segment 132 do not overlap each other, and the second magnetic conductive element 142 and the second segment 132 may at least partially overlap each other. Therefore, the size of the driving module 100 in specific direction may be reduced to achieve miniaturization.

Since the shapes of the first magnetic conductive element 141 and the third magnetic conductive element 143 may be identical or similar, and the shapes of the second magnetic conductive element 142 and the fourth magnetic conductive element 144 may be identical or similar, so it can be easily realized that in the direction that the first axis 501 extends, the first portion 621 of the first magnetic conductive element 141 at least partially overlap the third magnetic conductive element 143, the first end 601 of the first magnetic conductive element 141 at least partially overlap the third magnetic conductive element 143, the first end 601 of the first magnetic conductive element 141 does not overlap the fourth magnetic conductive element 144, the fourth end 604 of the second magnetic conductive element 142 at least partially overlap the fourth magnetic conductive element 144, and the fourth end 604 of the second magnetic conductive element 142 does not overlap the third magnetic conductive element 143. Therefore, the size of the driving module 100 in specific directions may be reduced to achieve miniaturization.

Figure 7A:
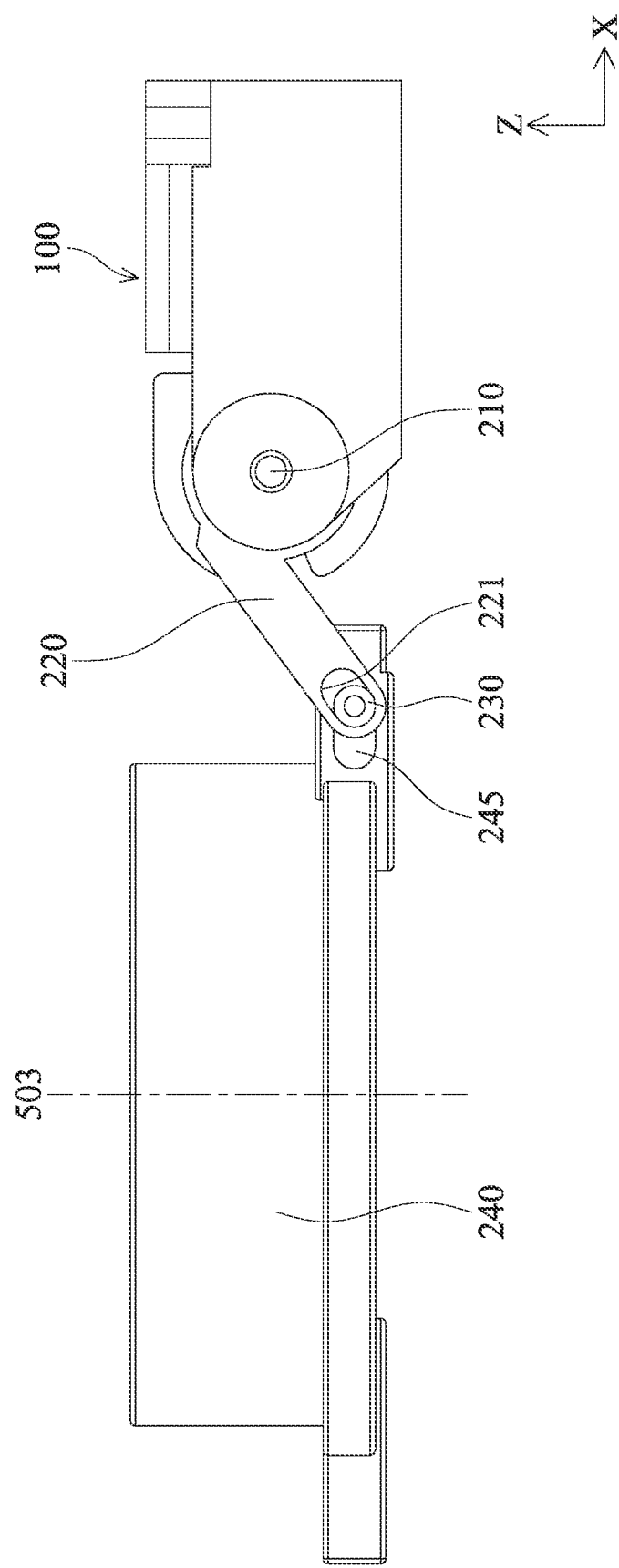
FIG. 7A is a schematic view when the driving module drives the connecting assembly.
Figure 7B:
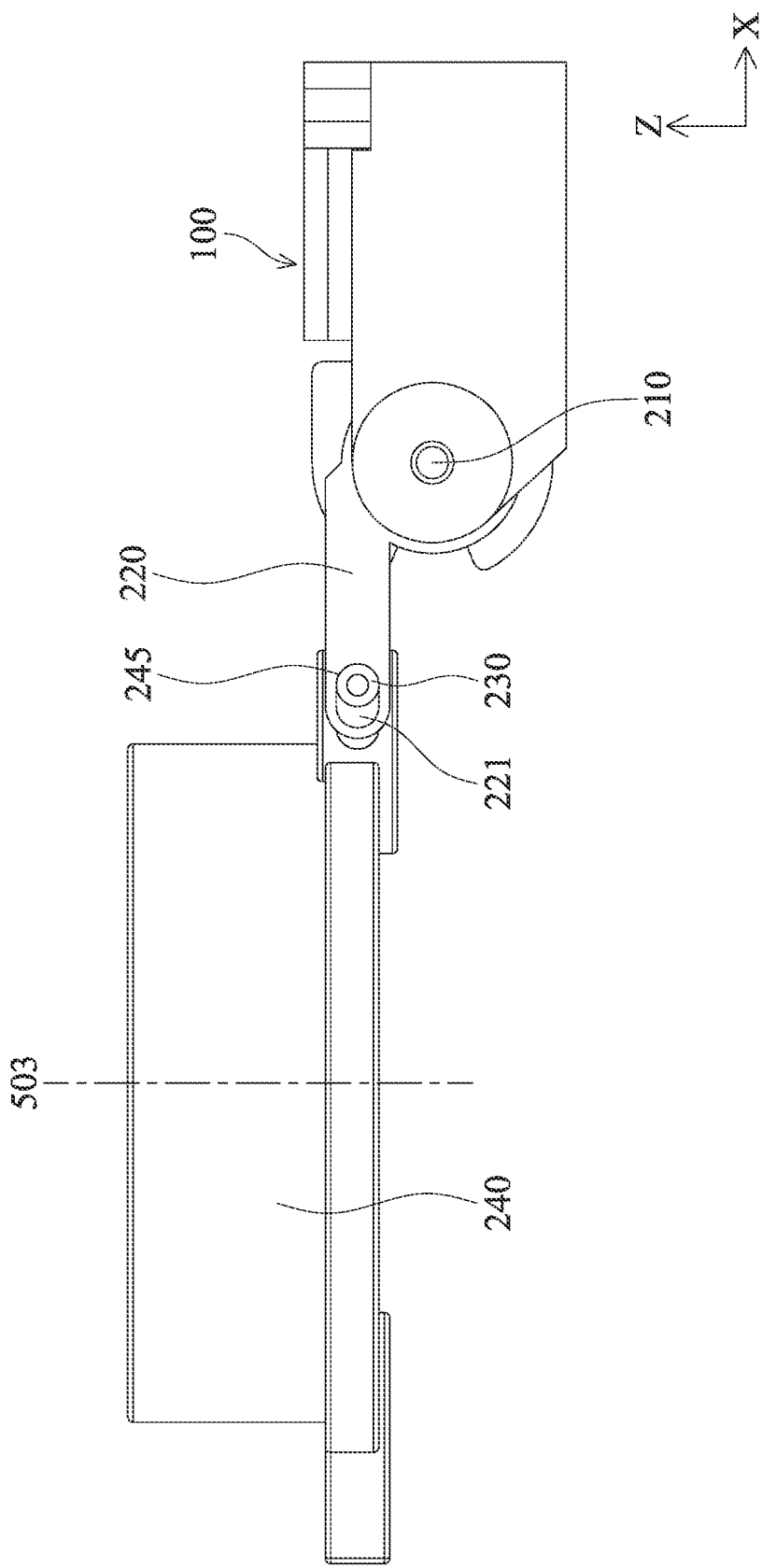
FIG. 7B is a schematic view when the driving module drives the connecting assembly.

FIG. 7A and FIG. 7B are schematic views when the driving module 100 drives the connecting assembly 200. The first connecting element 210 may be rotatably disposed on the bottom 110, and the second connecting element 220 may be affixed on the first connecting element 210 to rotate with the first connecting element 210. The magnetic element 150 may be affixed on the second connecting element 220 and may be column-shaped, so the magnetic element 150 may correspond to the magnetic field generated by the coil 130 and inducted by the magnetic conductive assembly 140. Therefore, the first connecting element 210 and the second connecting element 220 may rotate with the magnetic element 150.

The second connecting element 220 may have a first connecting hole 221, the fourth connecting element 240 may have a second connecting hole 245, and the first connecting hole 221 and the second connecting hole 245 at least partially overlap each other when viewed along the first axis 501. Therefore, the third connecting element 230 may be disposed in the first connecting hole 221 and the second connecting hole 245 to allow the third connecting element 230 movably connect to the second connecting element 220 and the fourth connecting element 240. For example, the first connecting hole 221 and the second connecting hole 245 may be strip-shaped, and the material of the third connecting element 230 may include metal to allow the third connecting element 230 rotate with the first connecting hole 221 and the second connecting hole 245 or slide in the direction that the first connecting hole 221 and the second connecting hole 245 extend. The third connecting element 230 that has metal material increases the durability when the third connecting element 230 is sliding, and the friction during sliding may be decreased. Therefore, the fourth connecting element 240 may be moved by the magnetic driving force generated by the driving module 100 in the direction that the third axis 503 extends.

Referring back to FIG. 1D and FIG. 1E, the second connecting element 220 may be at least partially disposed in the accommodating space 325, and the third connecting element 230 and the fourth connecting element 240 may be disposed in the accommodating space 325. Therefore, the connecting elements may be protected. The fourth connecting element 240 may have a first position limiting portion 241 and a second position limiting portion 242, the first position limiting portion 241 has a first stopping surface 243, and the second position limiting portion 242 has a third stopping surface 244. Moreover, the case 330 may include a first recess portion 331, a second recess portion 332, and a third recess portion 333, wherein the first position limiting portion 241 is disposed in the first recess portion 331, the second position limiting portion 242 is disposed in the second recess portion 332, and the third connecting element 230 is disposed in the third recess portion 333.

It should be noted that the first recess portion 331 has a second stopping surface 334 directly faces the first stopping surface 243, and the second recess portion 332 has a fourth stopping surface 335 directly faces the third stopping surface 244. In some embodiments, the first stopping surface 243 and the third stopping surface 244 face opposite directions, the first stopping surface 243 and the second stopping surface 334 are parallel, and the third stopping surface 244 and the fourth stopping surface 335 are parallel. For example, in some embodiments of the present disclosure, the first stopping surface 243, the second stopping surface 334, the third stopping surface 244, and the fourth stopping surface 335 may be parallel to the third axis 503. Therefore, when the fourth connecting element 240 is driven by the driving module 100, the fourth connecting element 240 will be limited by the first stopping surface 243, the second stopping surface 334, the third stopping surface 244, and the fourth stopping surface 335 that are parallel to the third axis 503, so the fourth connecting element 240 is only allowed to move along the third axis 503. Therefore, the optical axis of the optical element in the first optical module 400 may be ensured to be consistent. In some embodiments, the first stopping surface 243 and the third connecting element 230 are disposed on opposite sides of the fourth connecting element 240. In some embodiments, at least a gap is between the first stopping surface 243 and the second stopping surface 334, and/or between the third stopping surface 244 and the fourth stopping surface 335 to allow the fourth connecting element 240 to move relative to the case 330.

As shown in FIG. 2A and FIG. 2B, the optical system 1000 may further include two first positioning magnetic element 511, two second positioning magnetic element 512, and two third positioning magnetic element 513 disposed on opposite sides of the third connecting element 230, and may be disposed on the fixed portion 300, such as on the case 330. The first positioning magnetic element 511, the second positioning magnetic element 512, and the third positioning magnetic element 513 may be magnets, and the material of the third connecting element 230 may include magnetic conductive material, so the third connecting element 230 may interact with the magnetic field generated by the first positioning magnetic element 511, the second positioning magnetic element 512, and the third positioning magnetic element 513 to fix the position of the third connecting element 230.

For example, when the fourth connecting element 240 is driven by the driving module 100 to a lower position (FIG. 7A), the third connecting element 230 may be attract by the first positioning magnetic element 511 that positions at a lower position. On the contrary, when the fourth connecting element 240 is driven by the driving module 100 to a higher position (FIG. 7B), the third connecting element 230 may be attract by the second positioning magnetic element 512 and the first stopping surface 243 that positions at a higher position. Therefore, no energy is required to dispose the third connecting element 230 (and the fourth connecting element 240 connected to the third connecting element 230) to specific positions to reduce the required energy. In some embodiments, as shown in FIG. 1C, at least a portion of the third positioning magnetic element 513 is exposed from the top plate 320 when viewed along the third axis 503, so the third positioning magnetic element 513 may be installed easily.

In some embodiments, the distances between the substrate 310 and the first positioning magnetic element 511, between the substrate 310 and the second positioning magnetic element 512, and between the substrate 310 and the third positioning magnetic element 513 are different. For example, as shown in FIG. 2B, in the direction that the third axis 503 extends, a distance 521 is between the first positioning magnetic element 511 and the substrate 310, a distance 522 is between the second positioning magnetic element 512 and the substrate 310, a distance 523 is between the third positioning magnetic element 513 and the substrate 310, and the distance 521, the distance 522, and the distance 523 are different. For example, the distance 521 may be less than the distance 522, and the distance 522 may be less than the distance 523, so the third connecting element 230 may be attracted to be fixed on specific positions.

Figure 8:
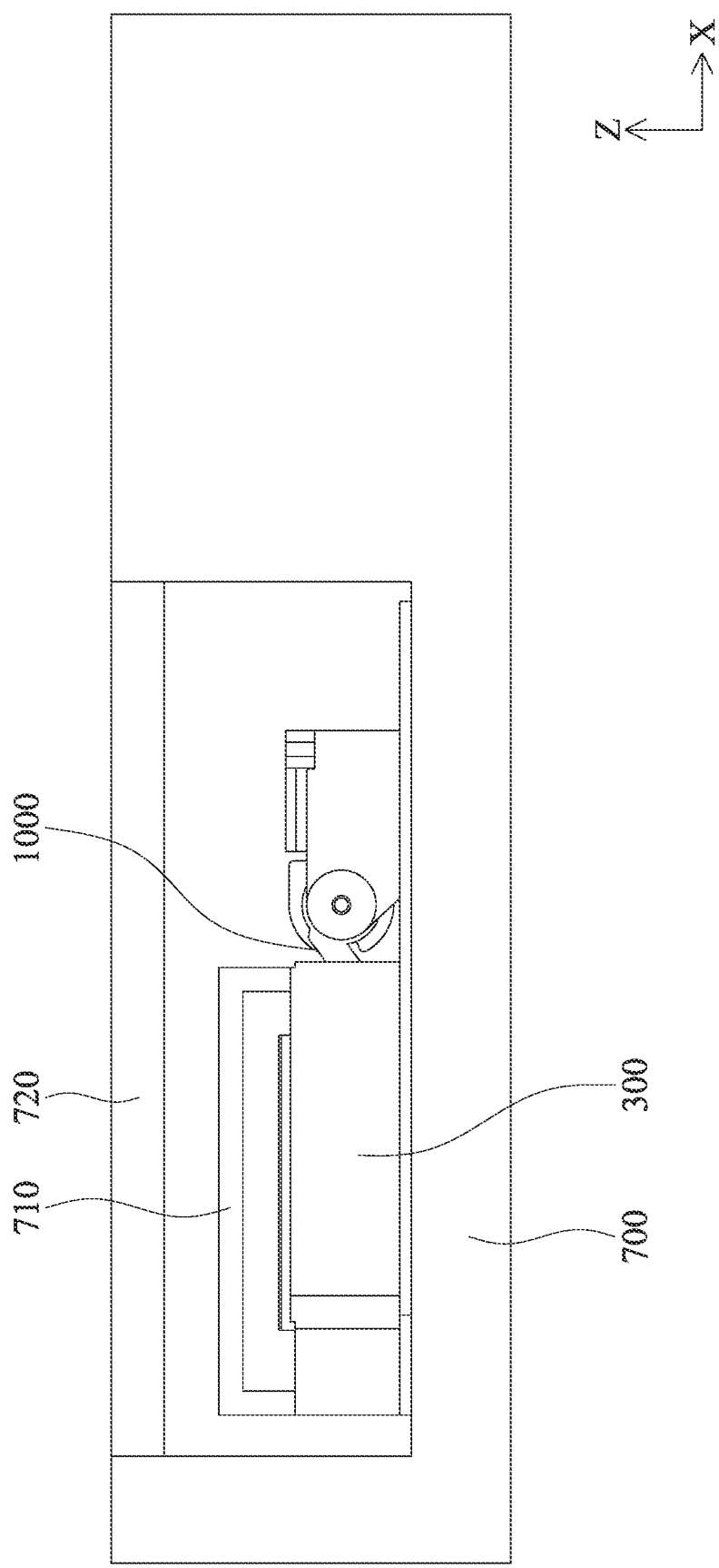
FIG. 8 is a schematic view when the optical system is disposed on an electronic device.

FIG. 8 is a schematic view when the optical system 1000 is disposed on an electronic device 700 (e.g. a cellphone). In some embodiments, the optical system 1000 may further include a first sealing element 710 disposed on the fixed portion 300. The first sealing element 710 may include transparent material, and may form a sealed space with the fixed portion 300. The first optical module 400 may be disposed in the sealed space to prevent dust outside the electronic device 700 in to the optical system 1000. Moreover, in some embodiments, a second sealing element 720 may be disposed on the electronic device 700. The material of the second sealing element 720 may include transparent material to further block the optical system 1000 from the external environment to increase the durability of the optical system 1000.

In summary, an optical system is provided. The optical system includes a first optical module, a fixed portion, and a driving module. The first optical module is used for connecting to a first optical element. The first optical module is movable relative to the fixed portion. The driving module is used for driving the first optical module to move relative to the fixed portion. The fixed portion includes an opening corresponding to the first optical module. Therefore, the first optical module is movable relative to the fixed portion in specific directions to achieve auto focus or changing focus.

The relative positions and size relationship of the elements in the present disclosure may allow the optical system achieving miniaturization in specific directions or for the entire mechanism. Moreover, different optical modules may be combined with the optical system to further enhance optical quality, such as the quality of photographing or accuracy of depth detection. Therefore, the optical modules may be further utilized to achieve multiple anti-vibration systems, so image stabilization may be significantly improved.

Although embodiments of the present disclosure and their advantages already have been described in detail, it should be understood that various changes, substitutions and alterations may be made herein without departing from the spirit and the scope of the disclosure as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are also intended to include within their scope of such processes, machines, manufacture, and compositions of matter, means, methods, or steps. In addition, each claim herein constitutes a separate embodiment, and the combination of various claims and embodiments are also within the scope of the disclosure.

What is claimed is:

1. An optical system, comprising:
a first optical module used for connecting to a first optical element;
a fixed portion comprising a substrate, wherein the first optical module is movable relative to the fixed portion; and
a driving module used for driving the first optical module to move relative to the fixed portion, comprising:
a coil, comprising:
a first segment extending along a first axis; and
a second segment extending along a second axis; and
a magnetic conductive assembly, comprising:
a first magnetic conductive element being strip-shaped and comprising a first end and a second end; and a second magnetic conductive element being strip-shaped and comprising a third end and a fourth end;
a bottom disposed on the substrate;
a base disposed on the bottom, wherein the base comprises plastic material, wherein the coil is affixed on the base, and the magnetic conductive assembly corresponds to the coil and is disposed on the base; and
a magnetic element corresponding to the magnetic conductive assembly;
wherein:
the fixed portion comprises an opening corresponding to the first optical module;
when viewed along the first axis, the first end does not overlap the second magnetic conductive element;
when viewed along the first axis, the second end overlaps the second magnetic conductive element;
a coil axis of the coil is parallel to the second axis;
the second axis is perpendicular to the first axis;
a third axis is perpendicular to the first axis and the second axis;
the first magnetic conductive element comprises magnetic conductive material;
the second magnetic conductive element comprises magnetic conductive material;
when viewed along the first axis, the third end overlaps the first magnetic conductive element;
when viewed along the first axis, the fourth end does not overlap the first magnetic conductive element;
when viewed along the first axis, a distance between the first end and the coil is different from a distance between the second end and the coil;
when viewed along the first axis, a distance between the third end and the coil is different from a distance between the fourth end and the coil;
when viewed along the first axis, the magnetic element is between the first end and the fourth end; and
the fourth end and the base at least partially overlap each other in the direction that the second axis extends.

2. The optical system as claimed in claim 1, wherein:
the first magnetic conductive element comprises:
a first magnetic conductive portion corresponding to the magnetic element; and
a first portion connecting to the first magnetic conductive portion;
the second magnetic conductive element comprises:
a second magnetic conductive portion corresponding to the magnetic element;
a second portion connecting to the second magnetic conductive portion;
a third portion connecting to the second portion; and
a fourth portion connecting to the third portion;
when viewed along the first axis, the first portion and the second portion do not overlap each other;
when viewed along the first axis, the first portion and the third portion extend in different directions;
when viewed along the first axis, the first portion at least partially overlaps the fourth portion;
the coil surrounds the first portion and the fourth portion;
when viewed along the first axis, the distance between the first end and the coil is greater than the distance between the third end and the coil;
when viewed along the first axis, the distance between the second end and the coil is less than the distance between the fourth end and the coil;
when viewed along the second axis, the first magnetic conductive element and the second magnetic conductive element do not overlap each other;
when viewed along the third axis, the first magnetic conductive element and the second magnetic conductive element do not overlap each other;
when viewed along the second axis, the first magnetic conductive element and the second segment do not overlap each other; and
when viewed along the second axis, the second magnetic conductive element at least partially overlaps the second segment.

3. The optical system as claimed in claim 2, wherein the magnetic conductive assembly further comprises:
a third magnetic conductive element being strip-shaped; and
a fourth magnetic conductive element being strip-shaped;
wherein:
the third magnetic conductive element comprises magnetic conductive material;
the fourth magnetic conductive element comprises magnetic conductive material;
in the direction that the first axis extends, the first magnetic conductive element, the second magnetic conductive element, the third magnetic conductive element, and the fourth magnetic conductive element arrange sequentially;
when viewed along the third axis, the first magnetic conductive element, the second magnetic conductive element, the third magnetic conductive element, and the fourth magnetic conductive element do not overlap each other;
in the direction that the first axis extends, the first portion of the first magnetic conductive element at least partially overlaps the third magnetic conductive element;
in the direction that the first axis extends, the first end of the first magnetic conductive element at least partially overlaps the third magnetic conductive element;
in the direction that the first axis extends, the first end of the first magnetic conductive element does not overlap the fourth magnetic conductive element;
in the direction that the first axis extends, the fourth end of the second magnetic conductive element at least partially overlaps the fourth magnetic conductive element; and
in the direction that the first axis extends, the fourth end of the second magnetic conductive element does not overlap the third magnetic conductive element.

4. The optical system as claimed in claim 3, wherein the base comprises:
a supporting portion;
a first positioning portion disposed on the supporting portion and used for supporting the coil;
a second positioning portion disposed on the supporting portion and used for supporting the coil;
a first opening position on the supporting portion and used for accommodating the first magnetic conductive element;
a second opening position on the supporting portion and used for accommodating the second magnetic conductive element; and
a first isolating portion between the first opening and the second opening;

wherein:
the coil is wound on the first positioning portion and the second positioning portion;
the first opening is between the first positioning portion and the second positioning portion;
the first positioning portion is between the first segment and the second segment of the coil;
the second positioning portion is between the first segment and the second segment of the coil;
the first isolating portion is between the first segment and the second segment of the coil;
the first isolating portion is between the first positioning portion and the second positioning portion;
when viewed along the third axis, at least a portion of the first positioning portion is exposed from the coil;
when viewed along the third axis, at least a portion of the second positioning portion is exposed from the coil;
when viewed along the third axis, at least a portion of the first isolating portion is exposed from the coil;
in the direction that the first axis extends, the width of the first positioning portion is different from the width of the first isolating portion; and
in the direction that the first axis extends, the width of the second positioning portion is different from the width of the first isolating portion.

5. The optical system as claimed in claim 4, further comprising a connecting assembly, wherein the driving module is connected to the first optical module through the connecting assembly;
wherein the connecting assembly comprises:
a first connecting element rotatably connected to the bottom;
a second connecting element affixed on the first connecting element;
a third connecting element movably connected to the second connecting element; and
a fourth connecting element movably connected to the third connecting element;
the fixed portion further comprises:
a case affixed on the substrate; and
a top plate affixed on the case;
wherein:
an accommodating space is formed between the top plate and the case;
the first optical module is disposed between the accommodating space;
the second connecting element is affixed on the magnetic element;
at least a portion of the second connecting element is disposed in the accommodating space;
the third connecting element is disposed in the accommodating space;
the fourth connecting element is disposed in the accommodating space;
the fourth connecting element comprises a first position limiting portion and a second position limiting portion;
the first position limiting portion comprises a first stopping surface; and
the second position limiting portion comprises a third stopping surface.

6. The optical system as claimed in claim 5, wherein:
the case comprises a first recess portion, a second recess portion, and a third recess portion;
the first position limiting portion is disposed in the first recess portion;
the second position limiting portion is disposed in the second recess portion;
the first recess portion comprises a second stopping surface directly facing the first stopping surface;
the second recess portion comprises a fourth stopping surface directly facing the third stopping surface;
the first stopping surface and the third connecting element are at opposite sides of the fourth connecting element;
the third connecting element is disposed in the third recess portion;
the first stopping surface and the second stopping surface are parallel; and
the third stopping surface and the fourth stopping surface are parallel.

7. The optical system as claimed in claim 6, wherein:
the first stopping surface, the second stopping surface, the third stopping surface, and the fourth stopping surface are parallel to the third axis;
the second connecting element comprises a first connecting hole being strip-shaped;
the fourth connecting element comprises a second connecting hole being strip-shaped;
the third connecting element passes through the first connecting hole and the second connecting hole;
the third connecting element is slidable in the first connecting hole and the second connecting hole;
when viewed along the first axis, at least a portion of the first connecting hole overlaps the second connecting hole; and
the material of the third connecting element comprises metal.

8. The optical system as claimed in claim 7, further comprising:
a first positioning magnetic element disposed on the fixed portion;
a second positioning magnetic element disposed on the fixed portion;
a third positioning magnetic element disposed on the fixed portion; and
a first sealing element disposed on the fixed portion;
wherein:
the third connecting element is magnetic conductive;
the distance between the first positioning magnetic element and the substrate, the distance between the second positioning magnetic element and the substrate, and the distance between the third positioning magnetic element and the substrate are different; and
a sealed space is formed between the first sealing element and the fixed portion used for sealing the first optical module.

* * * * *